(12) United States Patent
Nakabayashi et al.

(10) Patent No.: US 8,687,405 B2
(45) Date of Patent: Apr. 1, 2014

(54) PHASE CHANGE MEMORY AND METHOD FOR FABRICATING PHASE CHANGE MEMORY

(75) Inventors: Hajime Nakabayashi, Nirasaki (JP); Kenichi Oyama, Nirasaki (JP); Yoshihiro Hirota, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 53 days.

(21) Appl. No.: 13/487,826

(22) Filed: Jun. 4, 2012

(65) Prior Publication Data
US 2012/0314493 A1 Dec. 13, 2012

(30) Foreign Application Priority Data
Jun. 7, 2011 (JP) .................................. 2011-127522

(51) Int. Cl.
*G11C 11/00* (2006.01)
*H01L 47/00* (2006.01)
*H01L 21/20* (2006.01)

(52) U.S. Cl.
USPC ............... 365/148; 365/51; 365/63; 365/163; 257/4; 257/E21.003; 438/381

(58) Field of Classification Search
USPC ............................. 365/63, 148, 163; 438/381; 257/E21.003
See application file for complete search history.

(56) References Cited

U.S. PATENT DOCUMENTS

| | | | |
|---|---|---|---|
| 7,646,630 B2 | 1/2010 | Lowery et al. | |
| 2006/0151771 A1* | 7/2006 | Asano et al. | 257/2 |
| 2010/0019220 A1* | 1/2010 | Suh | 257/4 |
| 2011/0233508 A1* | 9/2011 | Araki et al. | 257/4 |

FOREIGN PATENT DOCUMENTS

JP 2009-245958 A 10/2009

* cited by examiner

*Primary Examiner* — Ly D Pham
(74) *Attorney, Agent, or Firm* — Nath, Goldberg & Meyer; Jerald L. Meyer

(57) ABSTRACT

A phase change memory includes an insulating layer on a substrate, an electrode layer having one pole and an electrode layer having another pole within the insulating layer, an opening portion whose lower portion on an upper portion of the insulating layer is substantially square or substantially rectangular, a phase change portion formed substantially parallel to a surface of the substrate along the respective sides of the lower portion of the opening portion, and two connection electrodes having a pole and connected to the phase change portion at two opposing corners of the lower portion of the opening portion connecting a diode portion connected to the electrode layer having one pole and the phase change portion, and two connection electrodes having another pole and connected to the phase change portion at the other two opposing corners connecting the phase change portion and the electrode layer having another pole.

6 Claims, 50 Drawing Sheets

PHASE CHANGE MEMORY AND METHOD FOR FABRICATING PHASE CHANGE MEMORY

CROSS-REFERENCE TO RELATED APPLICATION

This application claims the benefit of and priority from Japanese Patent Application No. 2011-127522, filed on Jun. 7, 2011, in the Japan Patent Office, the disclosure of which is incorporated herein in its entirety by reference.

TECHNICAL FIELD

The present disclosure relates to a phase change memory and a method for fabricating a phase change memory.

BACKGROUND

Currently, semiconductor memory, magnetic storage media, optical disks, and the like are presented as storage media. In particular, semiconductor memory, which is small and compact, has the characteristic that it can be electrically written or read at a high speed.

In a storage medium such as semiconductor memory, a single memory cell is required to be miniaturized to meet the demands for larger capacity or the like, but since a single memory cell requires a certain number of transistors and has a limitation in dimensions that can be processed due to a diffraction limit or the like in a fabrication process, there is a limitation in the miniaturization of a memory cell.

For this reason, in the related art, a phase change memory using a phase change material capable of further reducing the size of a single memory cell is disclosed. The phase change memory uses a phenomenon in which a phase change material has resistivity that greatly differs when the phase change material is in a crystalline state and an amorphous state.

However, in the related art, it is also disclosed that a phase change memory in which a phase change portion made of a phase change material is formed is to be perpendicular to a surface of a substrate for miniaturizing. However, in order to form such a phase change portion, it is required to form an opening portion to be perpendicular to the surface of the substrate and to bury the phase change material in the opening portion. For this reason, a film forming method such as sputtering cannot be used, and thus, a high-priced device is required due to limited types of film forming methods. In addition, when an organic metallic material is used as a raw material, carbon (C) or the like included in the organic metallic material is mixed as an impurity in the formed phase change portion, and thus reliability can be degraded.

Further, when the opening of the formed opening portion is narrow and deep, it is difficult to uniformly form a phase change material made of a ternary or quaternary compound without a defect or the like.

SUMMARY

The present disclosure aims to provide a phase change memory having high reliability at low cost.

According to one embodiment of the present disclosure, there is provided a phase change memory, including: an insulating layer formed on a substrate, an electrode layer having one pole and an electrode layer having another pole, both electrode layers being formed within the insulating layer, an opening portion whose lower portion is on an upper portion of the insulating layer and having a substantially square or substantially rectangular shape, a phase change portion formed substantially parallel to a surface of the substrate along the respective sides of the lower portion of the opening portion, and two connection electrodes having one pole and respectively connected to the phase change portion at two corners of the lower portion of the opening portion opposite each other among four corners, and two connection electrode having another pole and respectively connected to the phase change portion at the other two corners opposite each other, wherein the connection electrode having one pole connects a diode portion connected to the electrode layer having one pole and the phase change portion, and the connection electrode having another pole connects the phase change portion and the electrode layer having another pole.

According to another embodiment of the present disclosure, there is provided a method for fabricating a phase change memory, including: forming an opening portion having a substantially square or substantially rectangular shape on an insulating layer, forming a phase change film in the opening portion on the insulating layer, and etching back the phase change film and forming a phase change portion along the sides of a lower surface of the opening portion, wherein two electrodes having one pole and two electrodes having another pole are exposed at four corners of the opening portion, and the phase change portion is connected to the electrodes having one pole and the electrodes having another pole at the four corners of the opening portion.

According to another embodiment of the present disclosure, there is provided a method for fabricating a phase change memory, including: forming an electrode layer having one pole and a diode layer on an insulating layer formed on a substrate, forming an insulating layer covering the electrode layer having one pole and forming an electrode layer having another pole on the insulating layer covering the electrode layer having one pole, forming an insulating layer covering the electrode layer having another pole, forming a connection electrode having one pole and connected to the diode layer, and forming a connection electrode having another pole and connected to the electrode layer having another pole, forming an insulating layer with an opening portion formed to have a substantially square or substantially rectangular shape, forming a phase change film on a surface where the opening portion is formed, and etching back the phase change film and forming a phase change portion along the sides of a lower surface of the opening portion, wherein the phase change portion is connected to a part of the connection electrode having one pole and a part of the connection electrode having another pole at four corners of the lower surface of the opening portion.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1A:
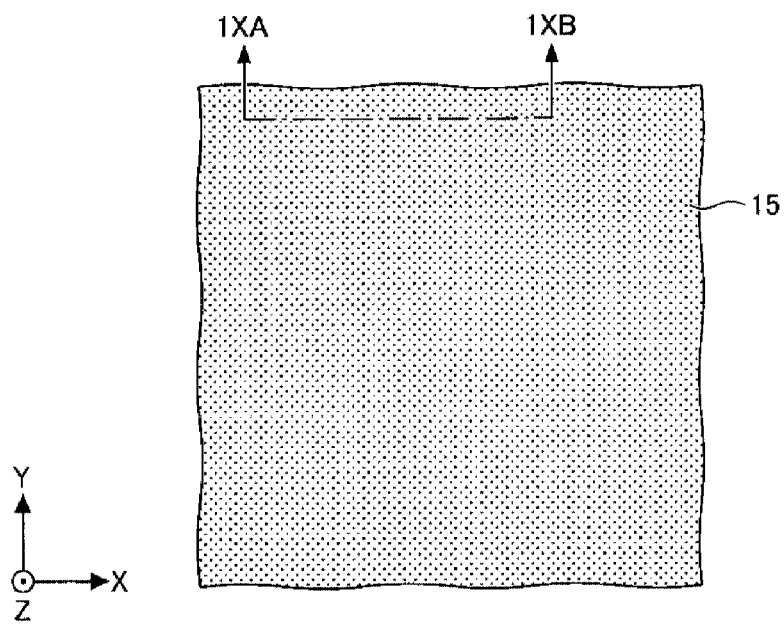
FIGS. 1A and B are views showing process (1) of a method for fabricating a phase change memory according to a first embodiment of the present disclosure.

Reference will now be made in detail to various embodiments, examples of which are illustrated in the accompanying drawings. In the following detailed description, numerous specific details are set forth in order to provide a thorough understanding of the present disclosure(s). However, it will be apparent to one of ordinary skill in the art that the present disclosure(s) may be practiced without these specific details. In other instances, well-known methods, procedures, systems, and components have not been described in detail so as not to unnecessarily obscure aspects of the various embodiments. Further, the same reference numerals are used for the same elements and a repeated description thereof will be omitted.

First Embodiment

Method for Fabricating a Phase Change Memory

A method for fabricating a phase change memory according to a first embodiment of the present disclosure will be described.

Figure 1B:
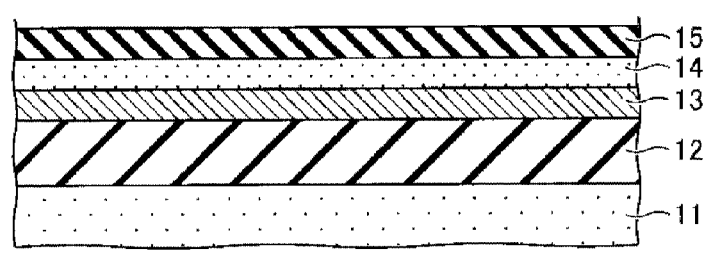

First, as shown in FIGS. 1A and 1B, a first insulating layer 12 made of TEOS or the like is formed on a substrate 11 constituted of a semiconductor substrate such as silicon or the like, and a lower electrode layer 13, a diode layer 14, and an SiN layer 15 are formed on the first insulating layer 12 through sputtering, chemical vapor deposition (CVD), or the like. The lower electrode layer 13 is made of a conductive material such as metal or the like, and the diode layer 14 is made of a semiconductor material or the like such that a PN junction, a Schottky junction or the like is formed. FIG. 1A is a top view in the process, and FIG. 1B is a sectional view taken along alternating long and short dashed line 1XA-1XB. It is assumed that a direction perpendicular to the surface of the substrate 11 is the Z-axis direction, the surface of the substrate 11 is an XY surface, and the X-axis and Y-axis are perpendicular.

Figure 2A:
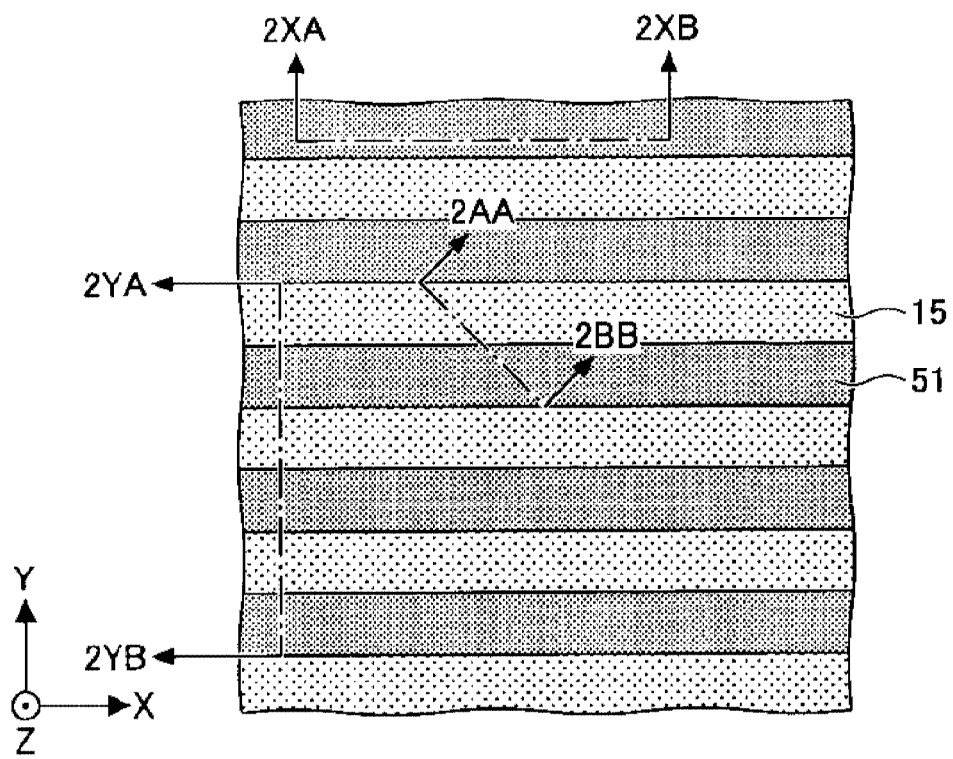
FIGS. 2A to 2D are views showing process (2) of a method for fabricating a phase change memory according to the first embodiment.
Figure 2B:
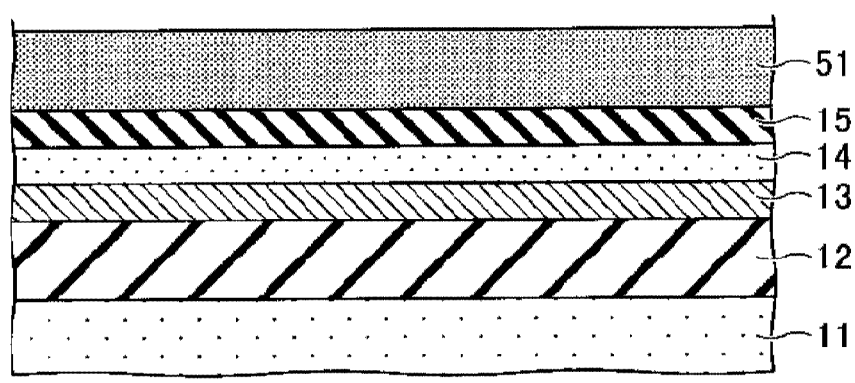
Figure 2C:
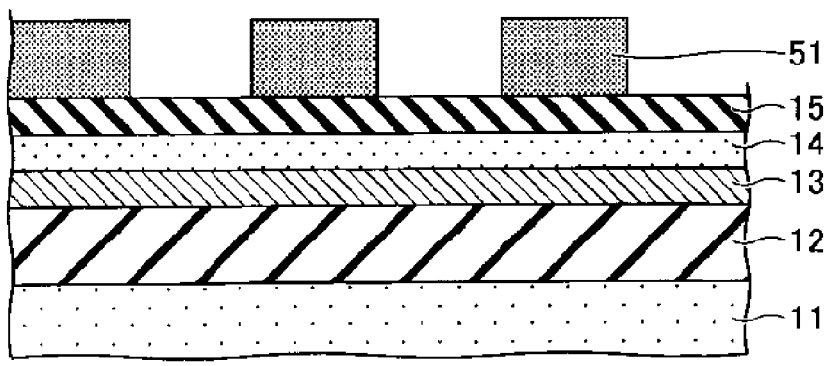
Figure 2D:
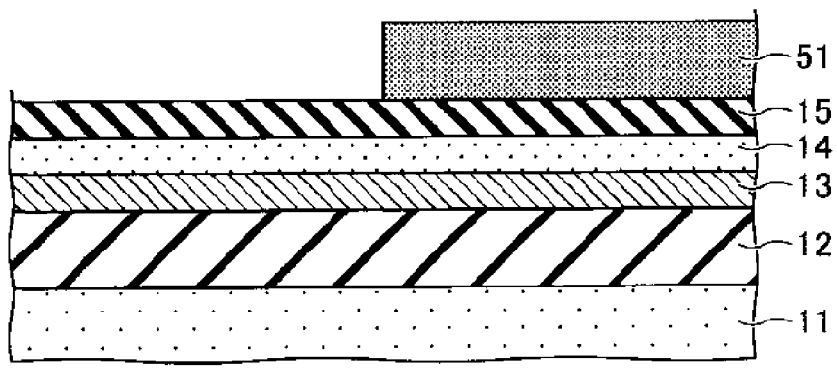

Next, as shown in FIGS. 2A to 2D, a resist pattern 51 is formed on the SiN layer 15. Specifically, a photoresist is applied to the surface of the SiN layer 15, and exposed and developed by an exposing device to form the resist pattern 51. The resist pattern 51 serves to form a lower electrode by separating the lower electrode 13 to be described later. FIG. 2A is a top view in the process, FIG. 2B is a sectional view taken along alternating long and short dashed line 2XA-2XB, FIG. 2C is a sectional view taken along alternating long and short dashed line 2YA-2YB, and FIG. 2D is a sectional view taken along alternating long and short dashed line 2AA-2BB.

Figure 3A:
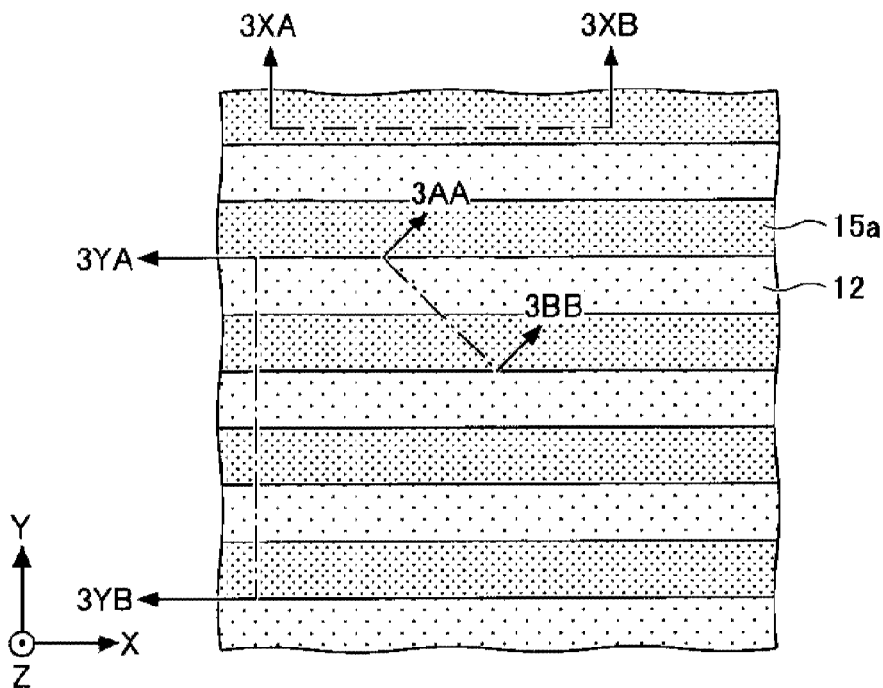
FIGS. 3A to 3D are views showing process (3) of a method for fabricating a phase change memory according to the first embodiment.
Figure 3B:
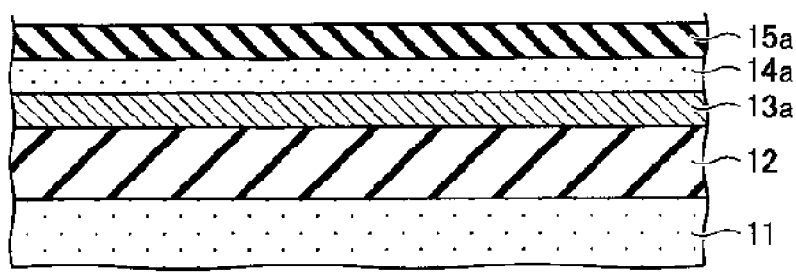
Figure 3C:
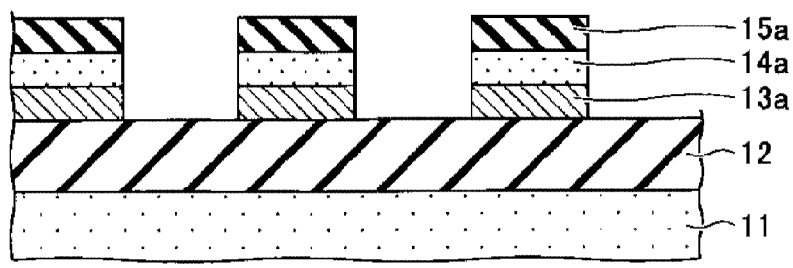
Figure 3D:
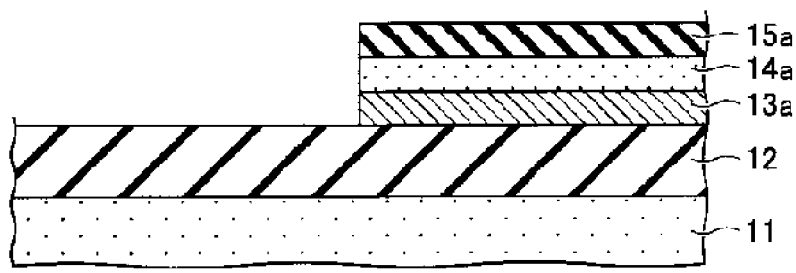

Next, as shown in FIGS. 3A to 3D, the lower electrode layer 13, the diode layer 14, and the SiN layer 15 at a region where the resist pattern 51 is not formed are removed. Specifically, the SiN layer 15 at the region where the resist pattern 51 is not formed is removed by reactive ion etching (RIE) or the like, and then, the resist pattern 51 is removed by an organic solvent or the like. Thereafter, by using a remaining SiN layer 15a as a mask, the diode layer 14 and the lower electrode layer 13 at the region where the SiN layer 15a is not formed are removed. Accordingly, a diode layer 14a and a lower electrode layer 13a serving as a lower electrode are formed. FIG. 3A is a top view in the process, FIG. 3B is a sectional view taken along alternating long and short dashed line 3XA-3XB, FIG. 3C is a sectional view taken along alternating long and short dashed line 3YA-3YB, and FIG. 3D is a sectional view taken along alternating long and short dashed line 3AA-3BB.

Figure 4A:
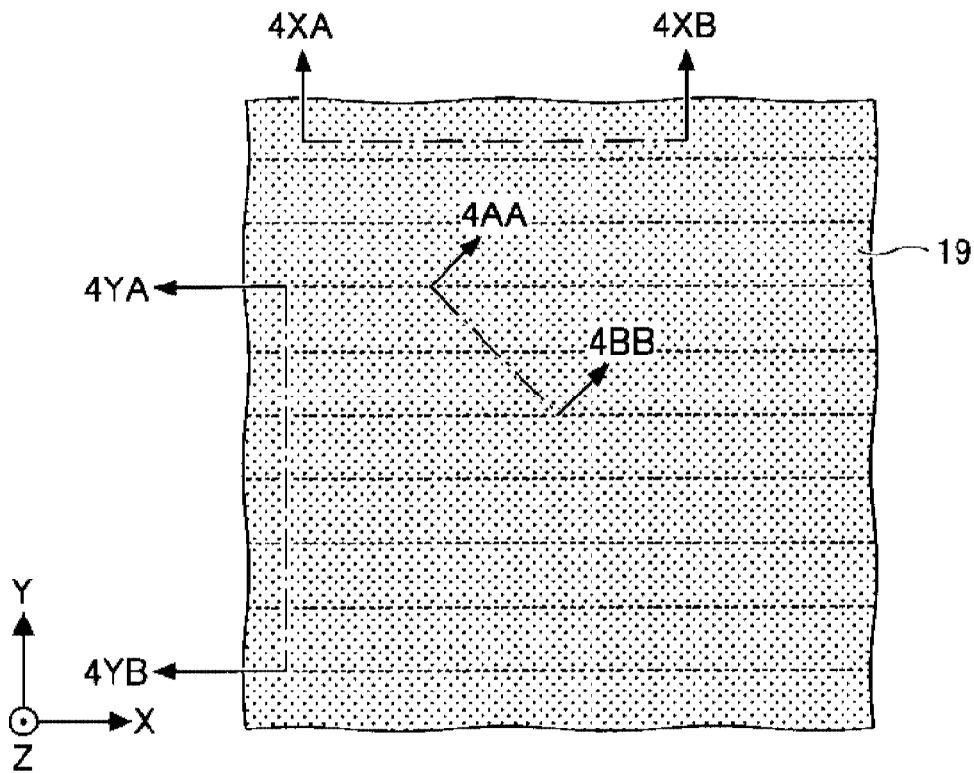
FIGS. 4A to 4D are views showing process (4) of a method for fabricating a phase change memory according to the first embodiment.
Figure 4B:
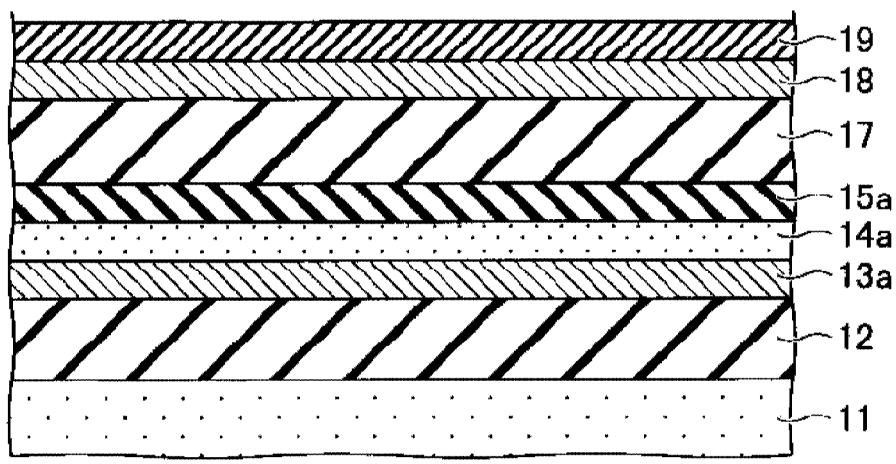
Figure 4C:
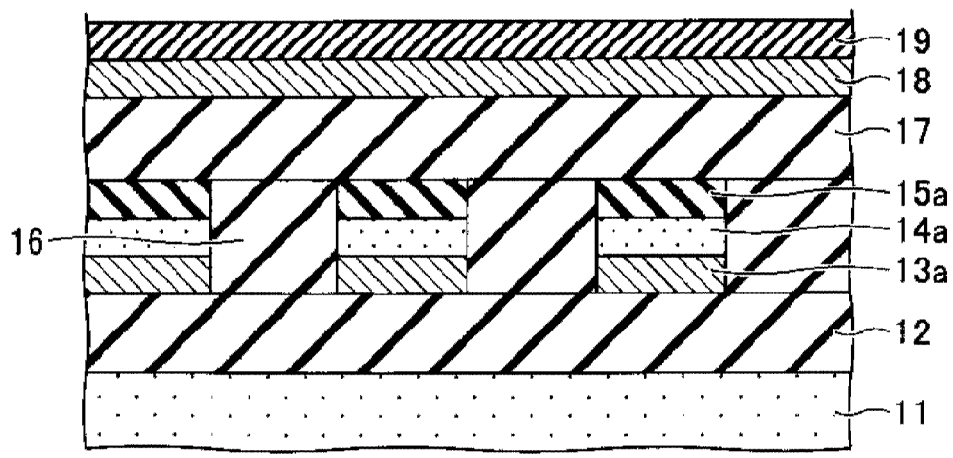
Figure 4D:
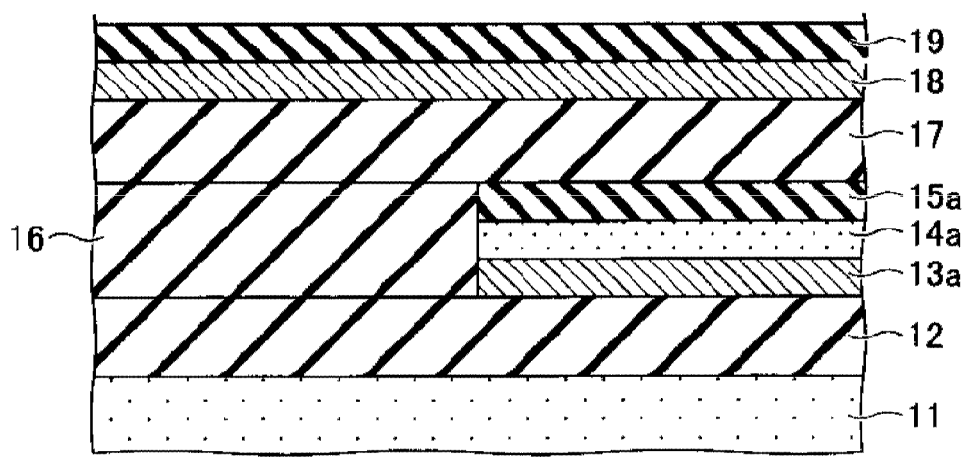

Next, as shown in FIGS. 4A to 4D, a second insulating layer 16, a third insulating layer 17, an upper electrode 18, and a SiN layer 19 are formed. Specifically, an insulating film made of TEOS or the like is formed on an overall region where the lower electrode layer 13a, the diode layer 14a, and the SiN layer 15a are formed, and then polished until the surface of the SiN layer 15a is exposed through chemical mechanical polishing (CMP) or the like. Accordingly, the second insulating layer 16 is formed on the exposed region of the first insulating layer 12, up to the height of the lower electrode layer 13a, the diode layer 14a, and the SiN layer 15a. Thereafter, the third insulating layer 17 made of TEOS or the like is formed, and the upper electrode layer 18 and the SiN layer 19 are formed on the third insulating layer 17 through sputtering, CVD, or the like. FIG. 4A is a top view in the process, FIG. 4B is a sectional view taken along alternating long and short dashed line 4XA-4XB, FIG. 4C is a sectional view taken along alternating long and short dashed line 4YA-4YB, and FIG. 4D is a sectional view taken along alternating long and short dashed line 4AA-4BB.

Figure 5A:
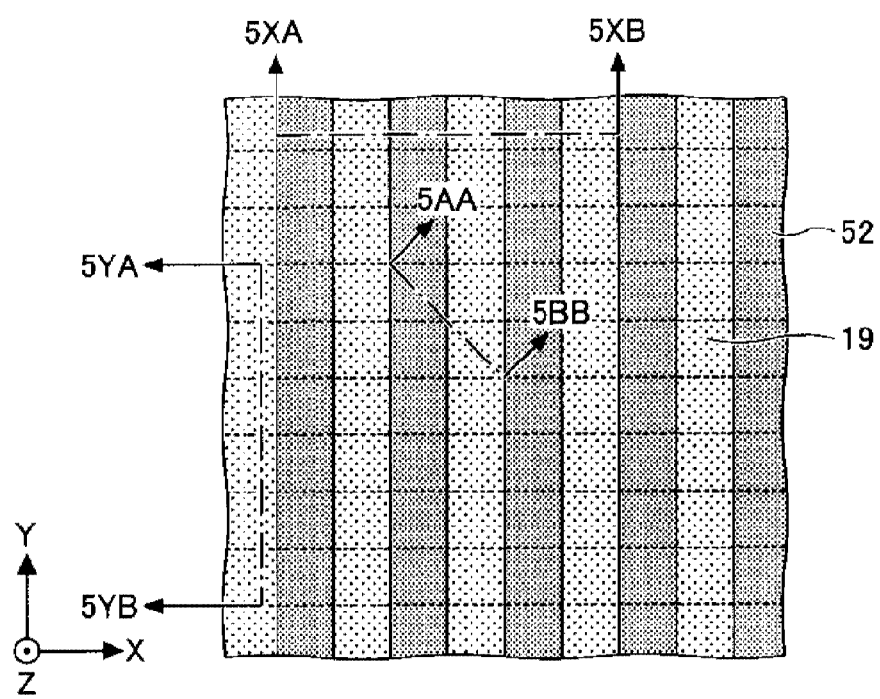
FIGS. 5A to 5D are views showing process (5) of a method for fabricating a phase change memory according to the first embodiment.
Figure 5B:
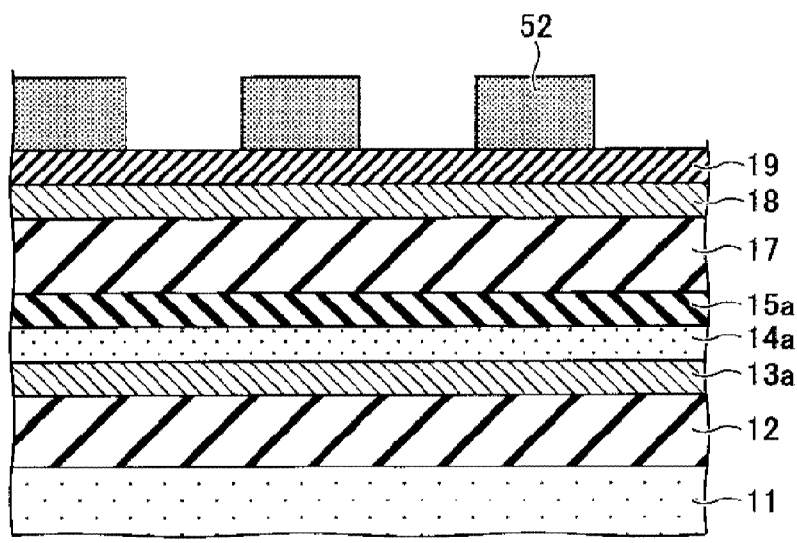
Figure 5C:
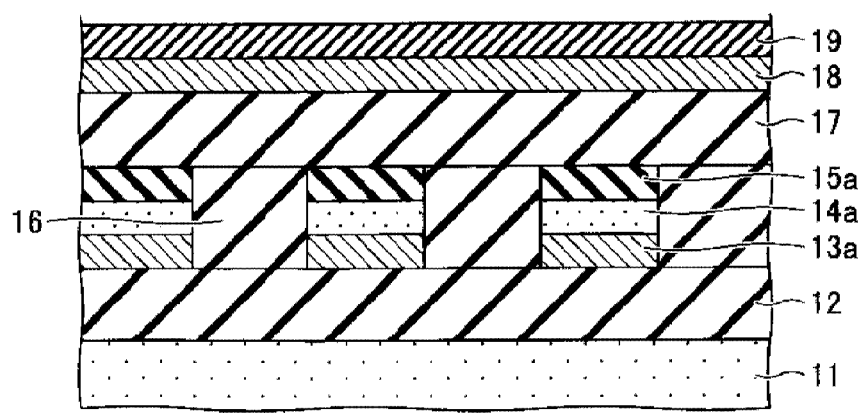
Figure 5D:
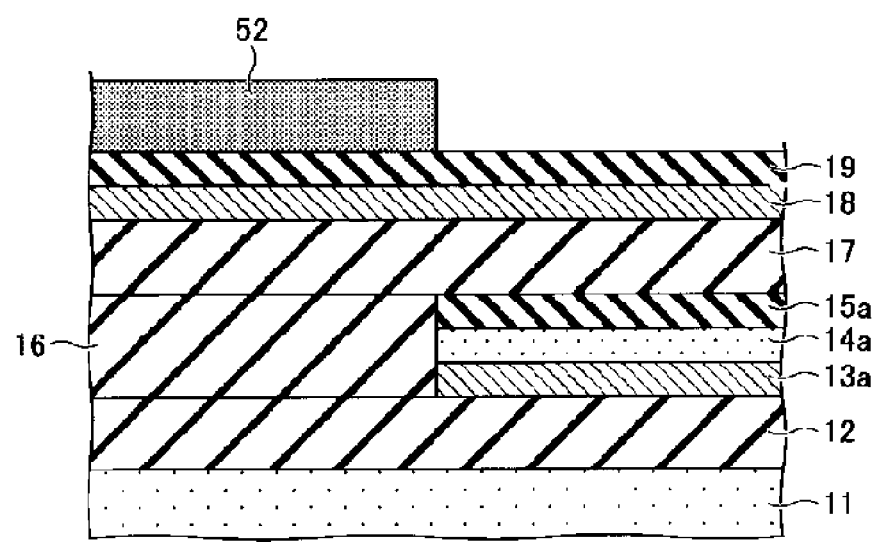

Next, as shown in FIGS. 5A to 5D, a resist pattern 52 is formed on the SiN layer 19. Specifically, a photoresist is applied to the surface of the SiN layer 19, and exposed and developed by an exposing device to form the resist pattern 52. The resist pattern 52 serves to form an upper electrode by separating the upper electrode layer 18 to be described later. FIG. 5A is a top view in the process, FIG. 5B is a sectional view taken along alternating long and short dashed line 5XA-5XB, FIG. 5C is a sectional view taken along alternating long and short dashed line 5YA-5YB, and FIG. 5D is a sectional view taken along alternating long and short dashed line 5AA-5BB.

Figure 6A:
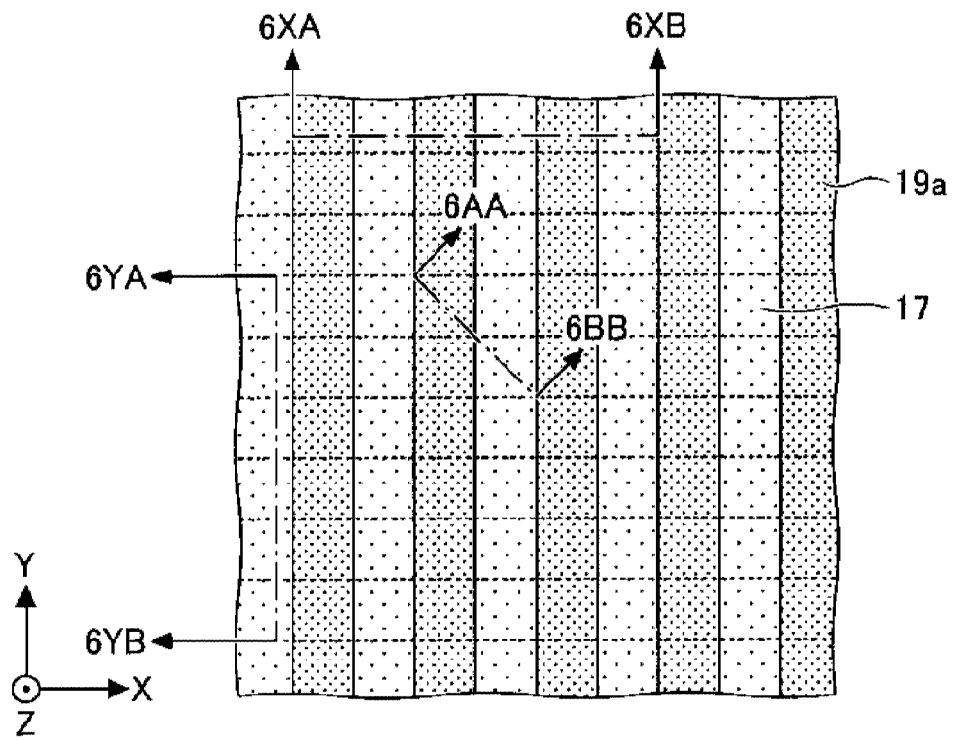
FIGS. 6A to 6D are views showing process (6) of a method for fabricating a phase change memory according to the first embodiment.
Figure 6B:
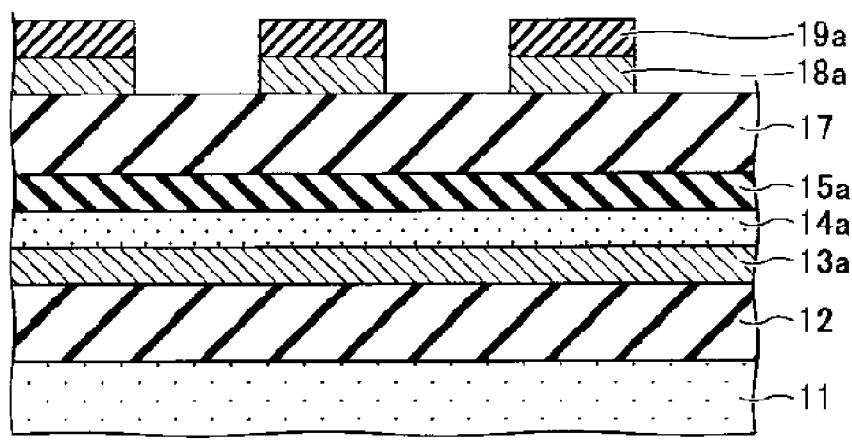
Figure 6C:
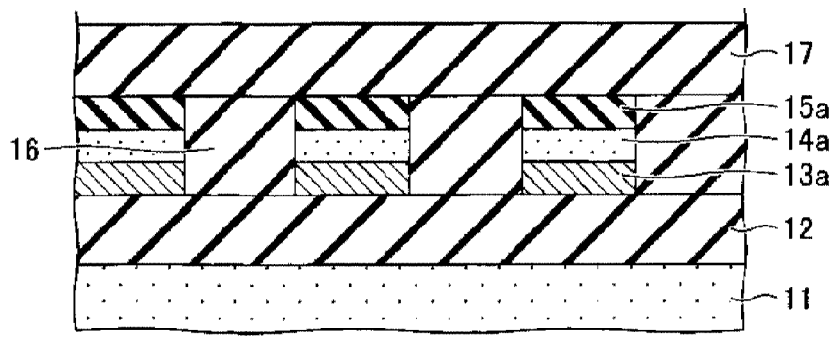
Figure 6D:
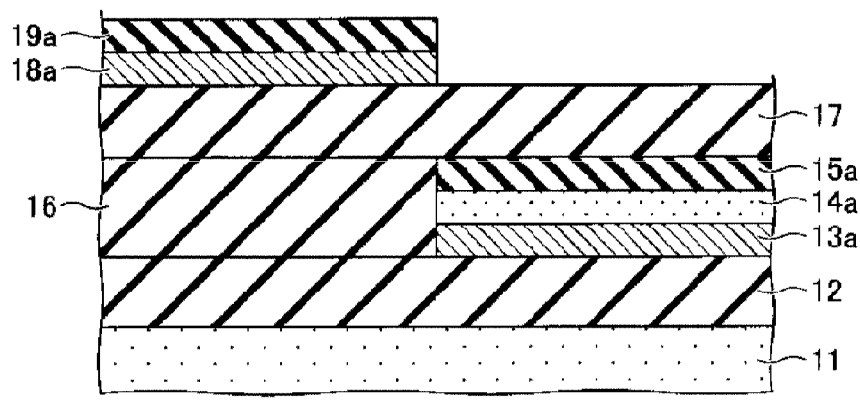
Figure 7A:
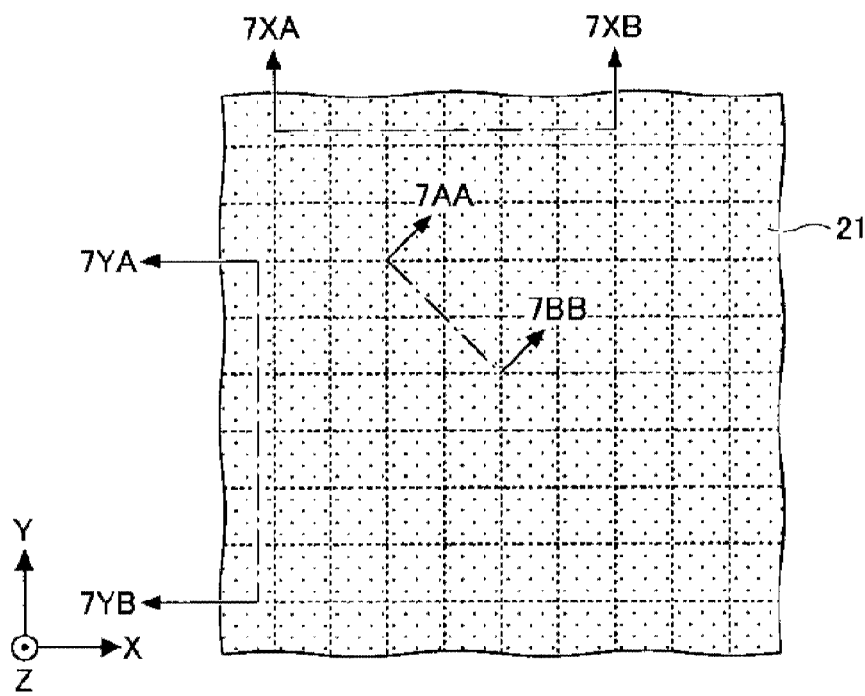
FIGS. 7A to 7D are views showing process (7) of a method for fabricating a phase change memory according to the first embodiment.
Figure 7B:
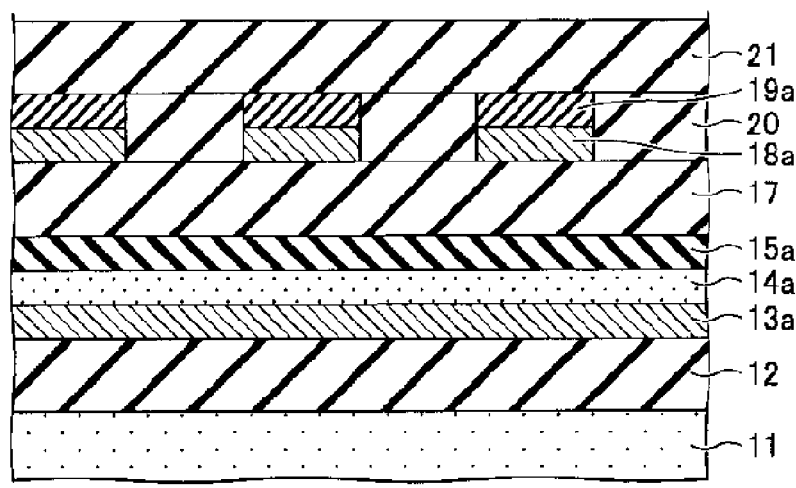
Figure 7C:
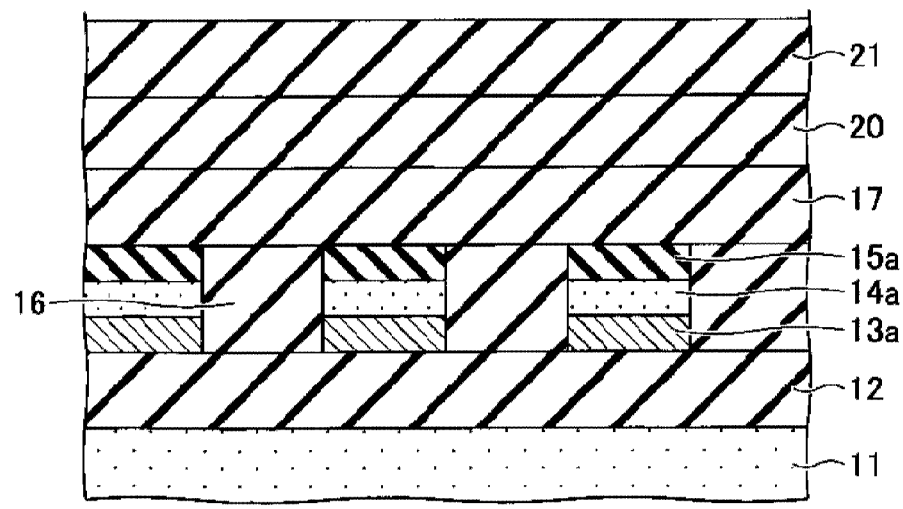
Figure 7D:
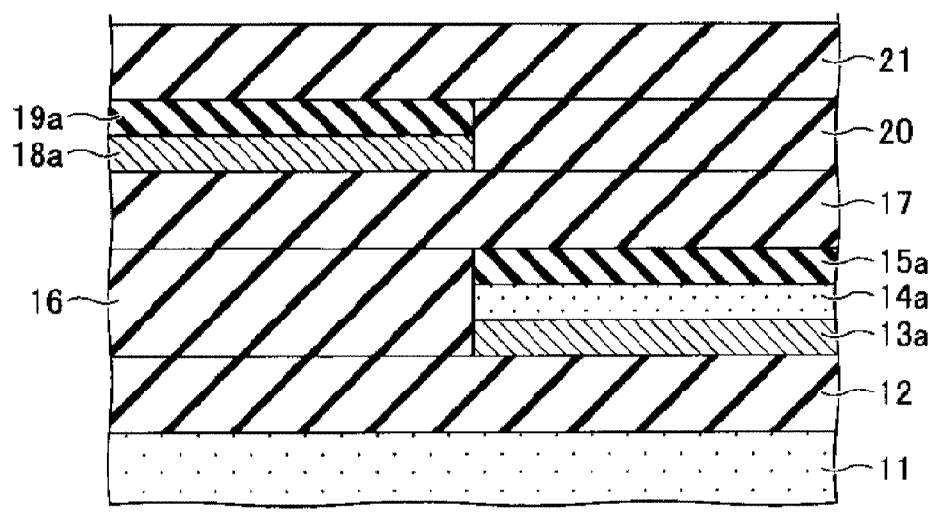

Next, as shown in FIGS. 6A to 6D, the upper electrode layer 18 and the SiN layer 19 at a region where the resist pattern 52 is not formed are removed. Specifically, the SiN layer 19 at the region where the resist pattern 52 is not formed is removed by RIE or the like, and then, the resist pattern 52 is removed by an organic solvent or the like. Thereafter, by using a remaining SiN layer 19a as a mask, the upper electrode layer 18 at the region where the SiN layer 19a is not formed is removed. Accordingly, an upper electrode layer 18a serving as an upper electrode is formed. FIG. 6A is a top view in the process, FIG. 6B is a sectional view taken along alternating long and short dashed line 6XA-6XB, FIG. 6C is a sectional view taken along alternating long and short dashed line 6YA-6YB, and FIG. 6D is a sectional view taken along alternating long and short dashed line 6AA-6BB.

Next, as shown in FIG. 7, a fourth insulating layer 20 and a fifth insulating layer 21 are formed. Specifically, an insulating film made of TEOS or the like is formed on an overall region where the upper electrode layer 18a and the SiN layer 19a are formed, and then polished until the surface of the SiN layer 19a is exposed through CMP or the like. Accordingly, the fourth insulating layer 20 is formed on the exposed region of the third insulating layer 17, up to the height of the upper electrode layer 18a and the SiN layer 19a. Thereafter, the fifth insulating layer 21 made of TEOS or the like is formed. FIG. 7A is a top view in the process, FIG. 7B is a sectional view taken along alternating long and short dashed line 7XA-7XB, FIG. 7C is a sectional view taken along alternating long and short dashed line 7YA-7YB, and FIG. 7D is a sectional view taken along alternating long and short dashed line 7AA-7BB.

Figure 8A:
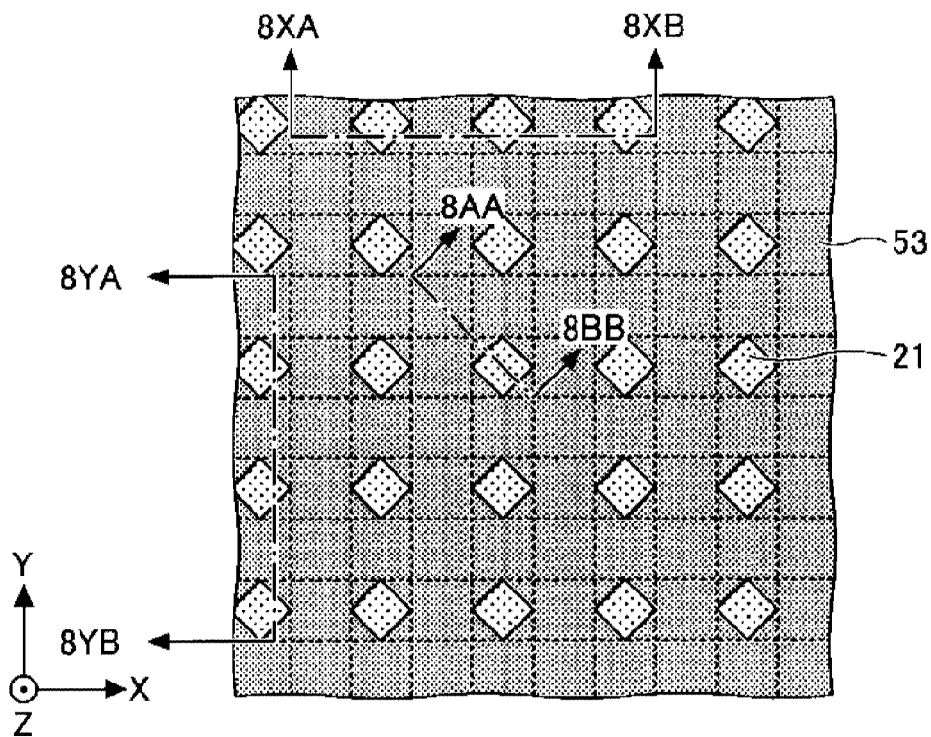
FIGS. 8A to 8D are views showing process (8) of a method for fabricating a phase change memory according to the first embodiment.
Figure 8B:
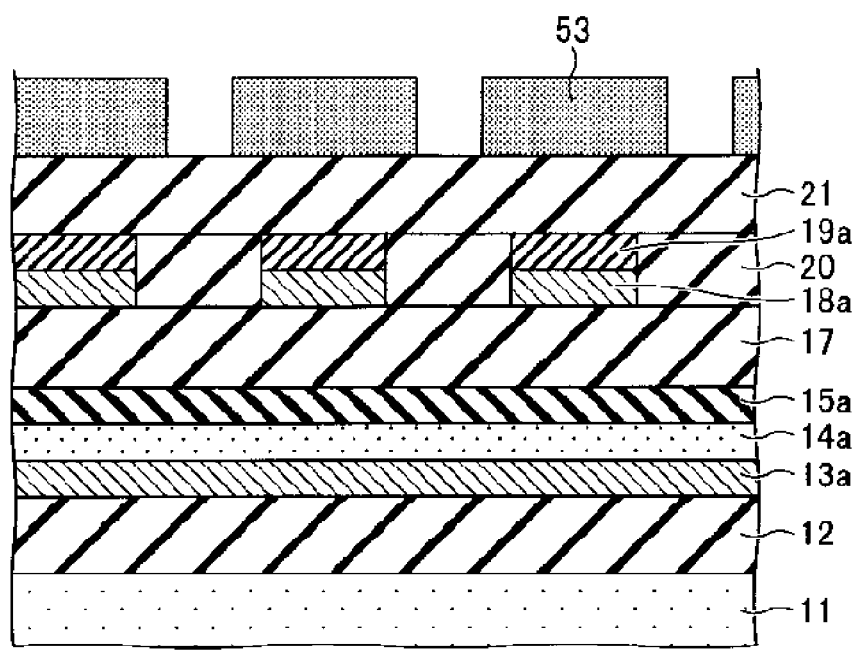
Figure 8C:
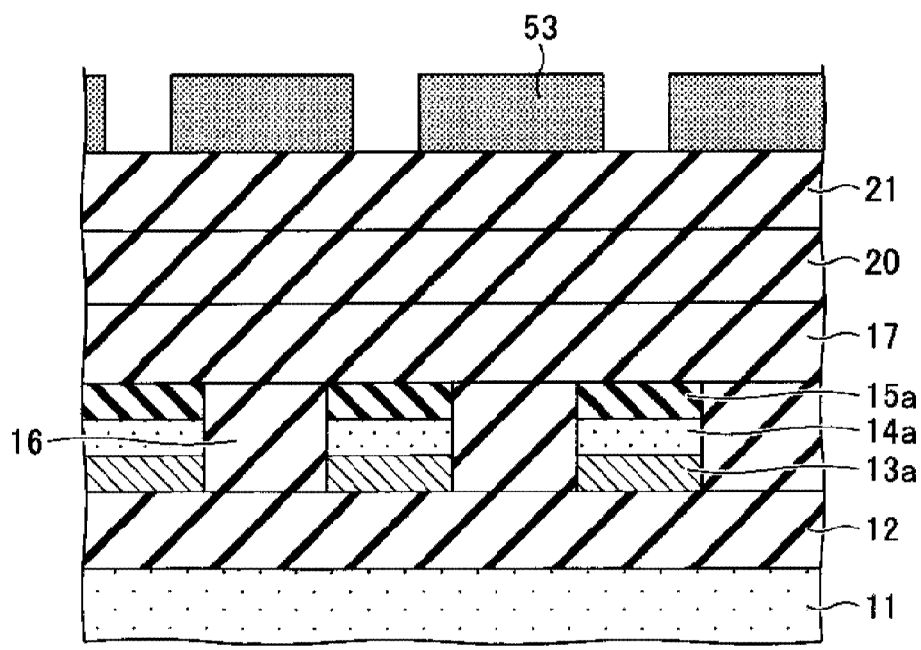
Figure 8D:
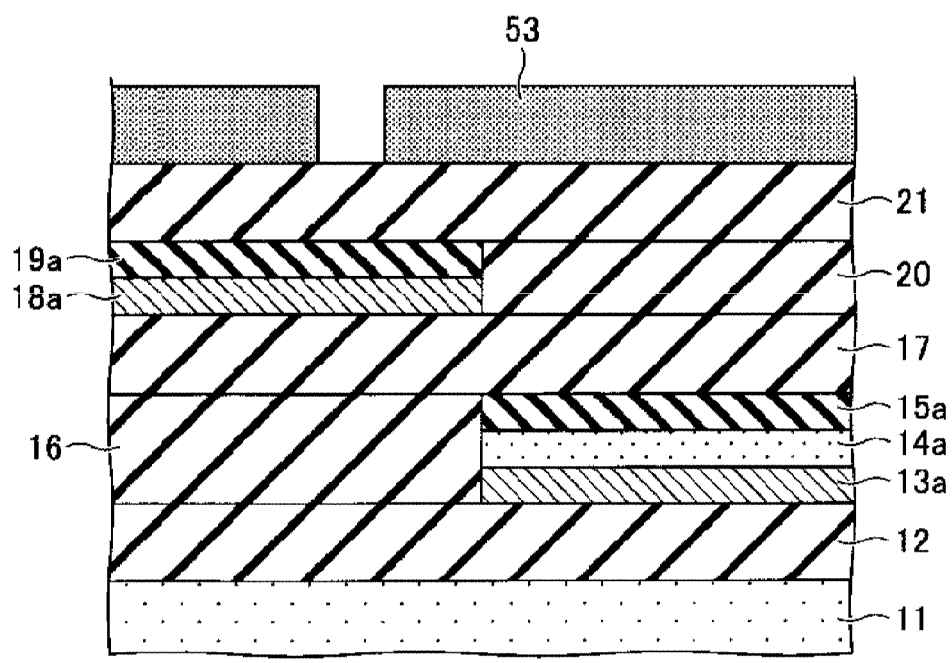

Next, as shown in FIGS. 8A to 8D, a resist pattern 53 is formed on the fifth insulating layer 21. Specifically, a photoresist is applied to the surface of the fifth insulating layer 21, and exposed and developed by an exposing device to form the resist pattern 53. The resist pattern 53 serves to form a connection electrode 31 to be described later. FIG. 8A is a top view in the process, FIG. 8B is a sectional view taken along alternating long and short dashed line 8XA-8XB, FIG. 8C is a sectional view taken along alternating long and short dashed line 8YA-8YB, and FIG. 8D is a sectional view taken along alternating long and short dashed line 8AA-8BB.

Figure 9A:
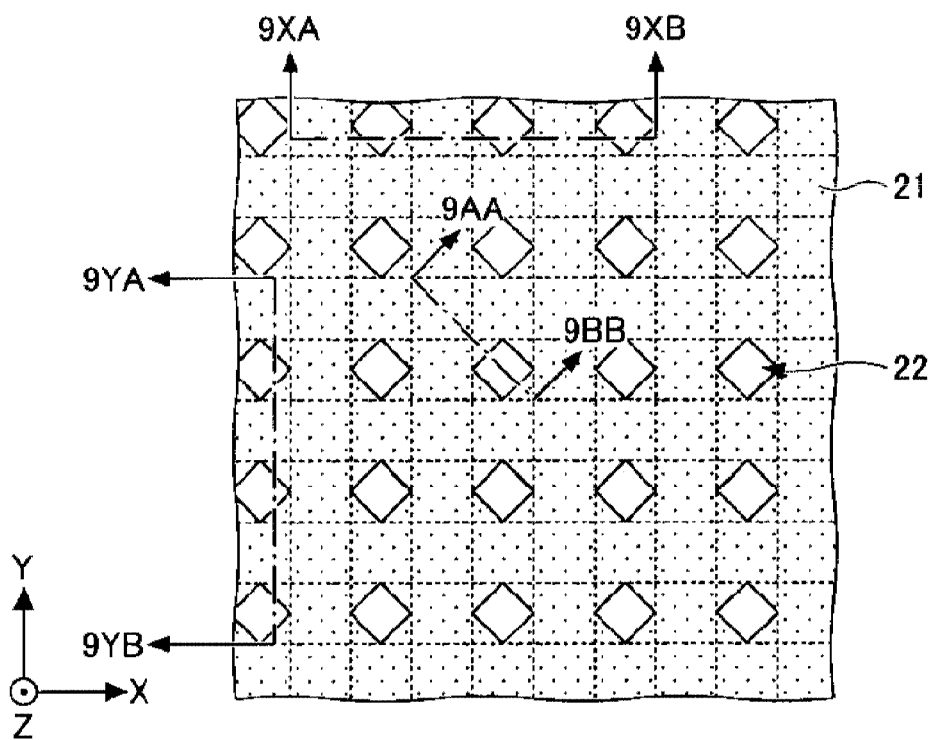
FIGS. 9A to 9D are views showing process (9) of a method for fabricating a phase change memory according to the first embodiment.
Figure 9B:
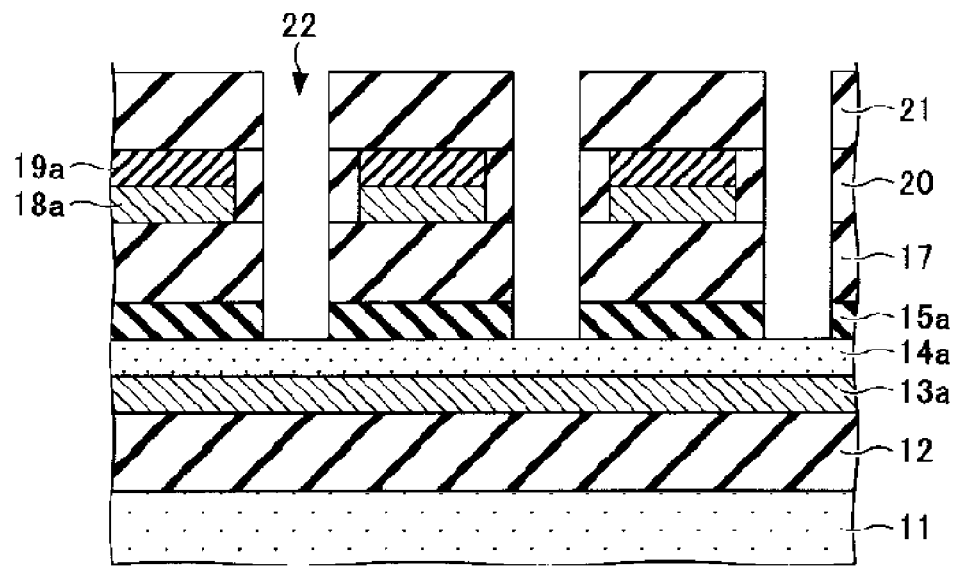
Figure 9C:
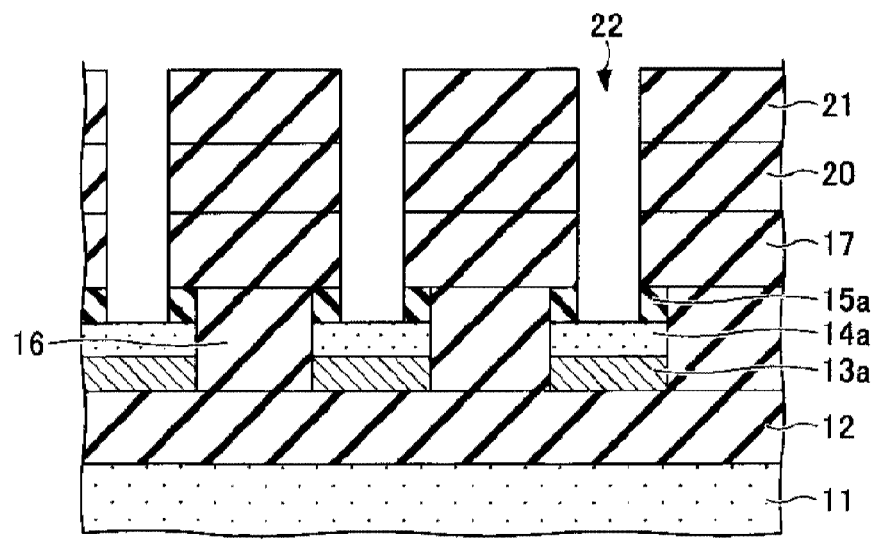
Figure 9D:
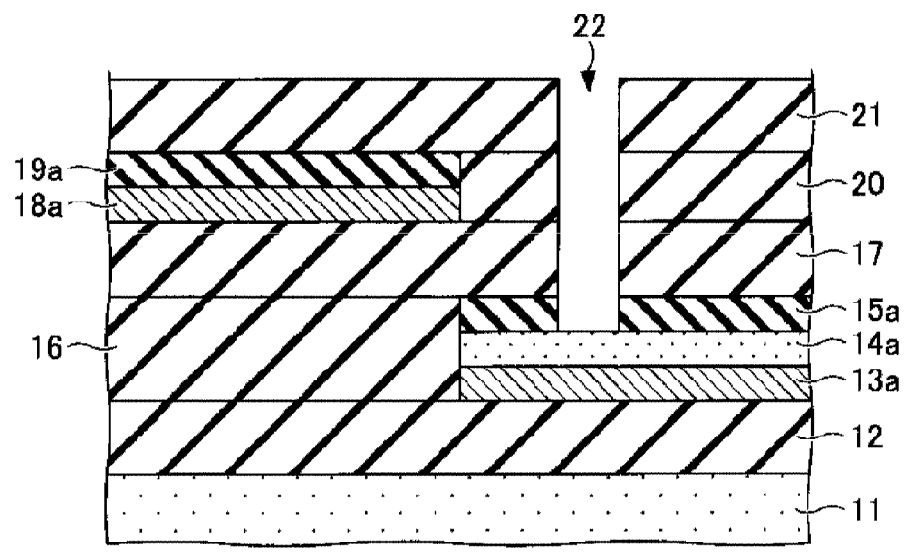

Next, as shown in FIGS. 9A to 9D, the SiN layer 15a, the third insulating layer 17, the fourth insulating layer 20, and the fifth insulating layer 21 at a region where the resist pattern 53 is not formed are removed through etching, such as RIE, to form an opening portion 22. The etching, by RIE or the like, is performed until the surface of the diode layer 14a is exposed. Thereafter, the resist pattern 53 is removed by an organic solvent or the like. FIG. 9A is a top view in the process, FIG. 9B is a sectional view taken along alternating long and short dashed line 9XA-9XB, FIG. 9C is a sectional view taken along alternating long and short dashed line 9YA-9YB, and FIG. 9D is a sectional view taken along alternating long and short dashed line 9AA-9BB.

Figure 10A:
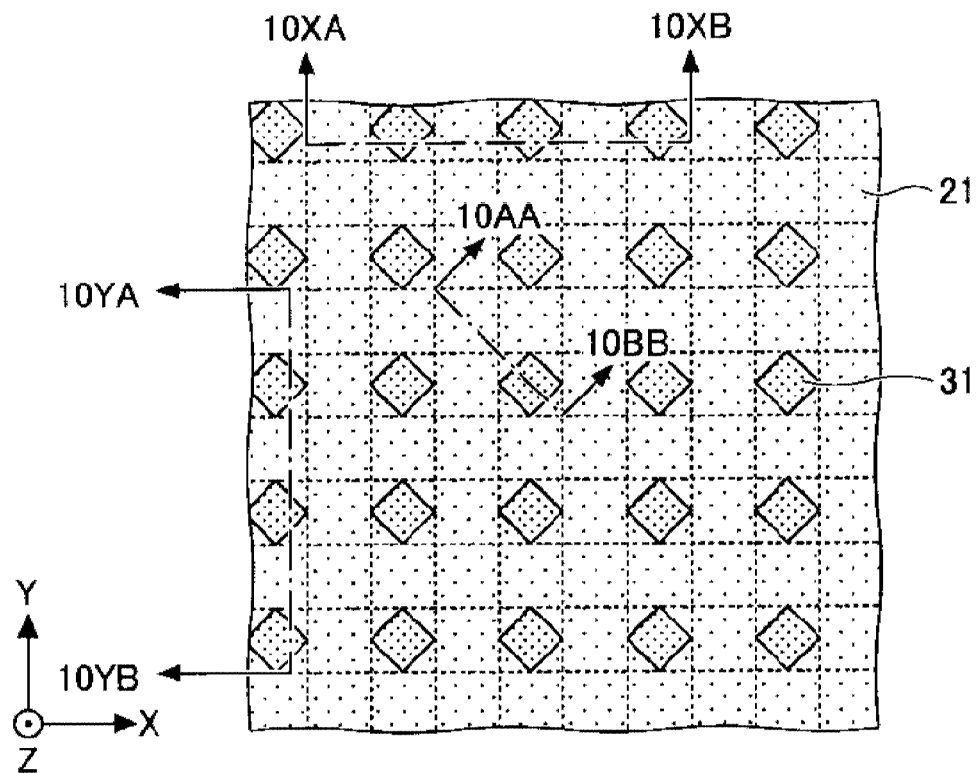
FIGS. 10A to 10D are views showing process (10) of a method for fabricating a phase change memory according to the first embodiment.
Figure 10B:
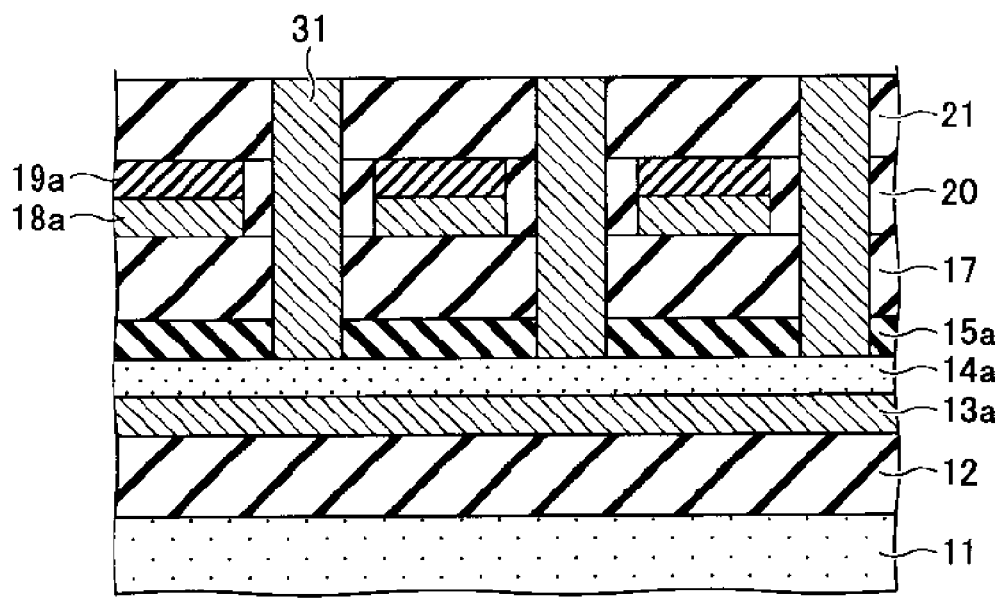
Figure 10C:
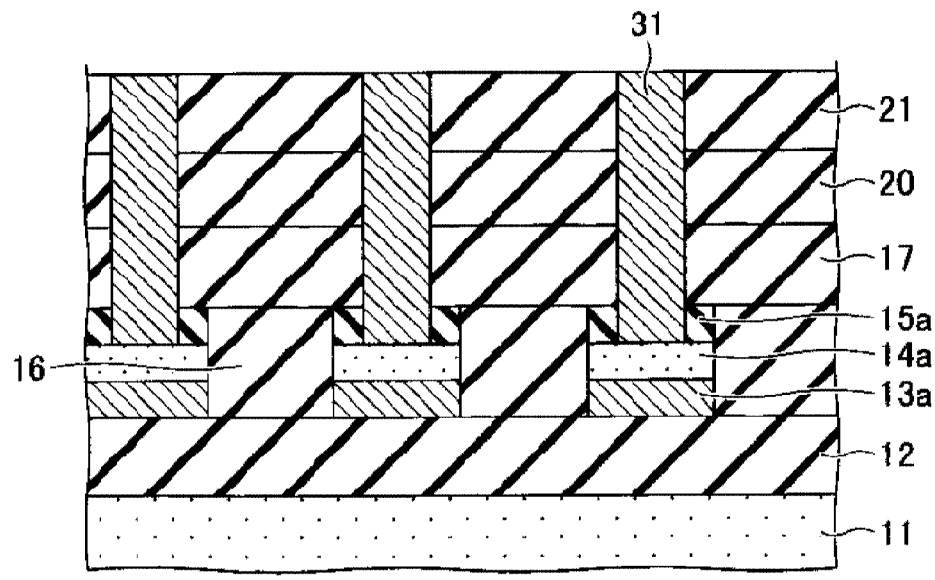
Figure 10D:
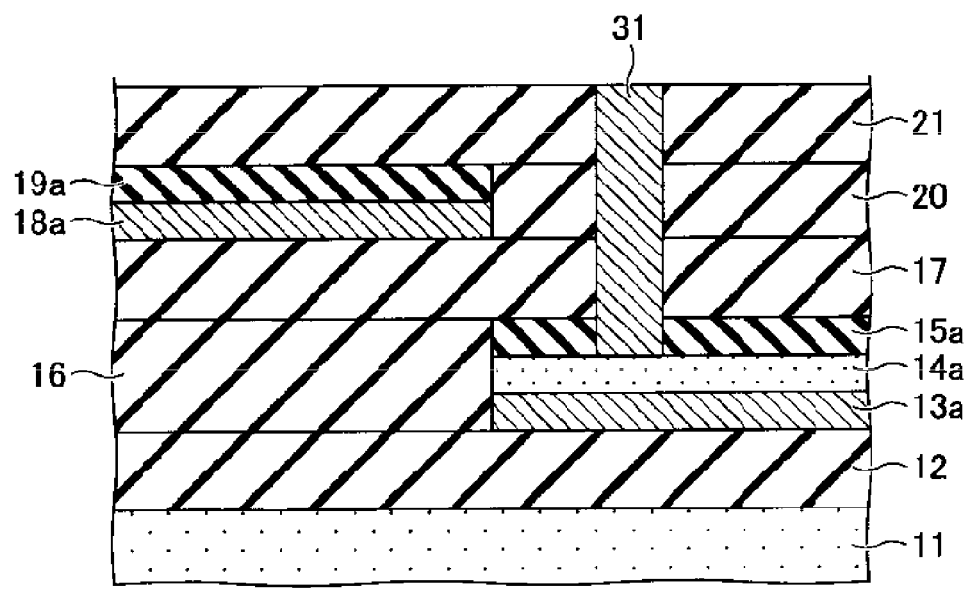

Next, as shown in FIGS. 10A to 10D, the connection electrode 31 is formed within the opening portion 22. Specifically, a film made of TiN or W is formed on the surface where the opening portion 22 is formed through CVD or the like. TiN or W is deposited on the surface of the fifth insulating layer 21 and, at the same time, is buried within the opening portion 22. Thereafter, CMP or the like is performed to remove the film made of TiN or W on the surface of the fifth insulating layer 21 to thereby form the connection electrode 31 by the TiN or W buried within the opening portion 22. FIG. 10A is a top view in the process, FIG. 10B is a sectional view taken along alternating long and short dashed line 10XA-10XB, FIG. 10C is a sectional view taken along alternating long and short dashed line 10YA-10YB, and FIG. 10D is a sectional view taken along alternating long and short dashed line 10AA-10BB.

Figure 11A:
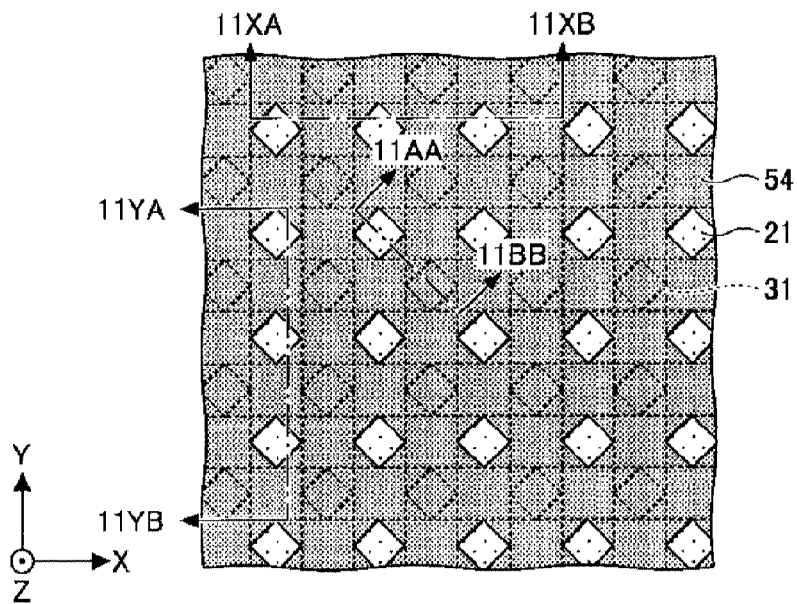
FIGS. 11A to 11D are views showing process (11) of a method for fabricating a phase change memory according to the first embodiment.
Figure 11B:
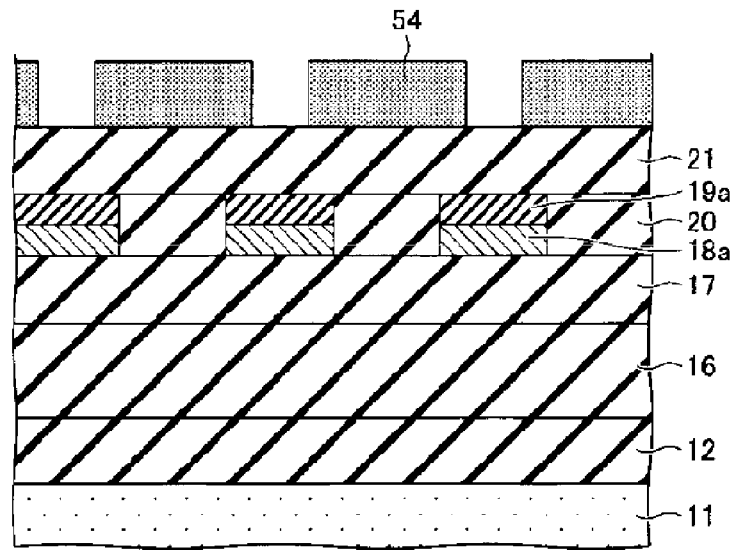
Figure 11C:
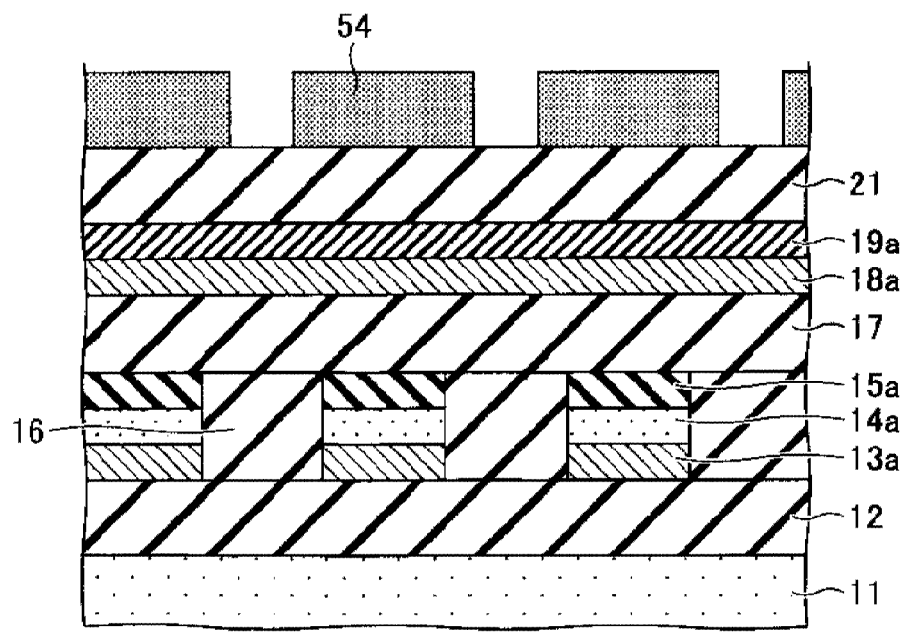
Figure 11D:
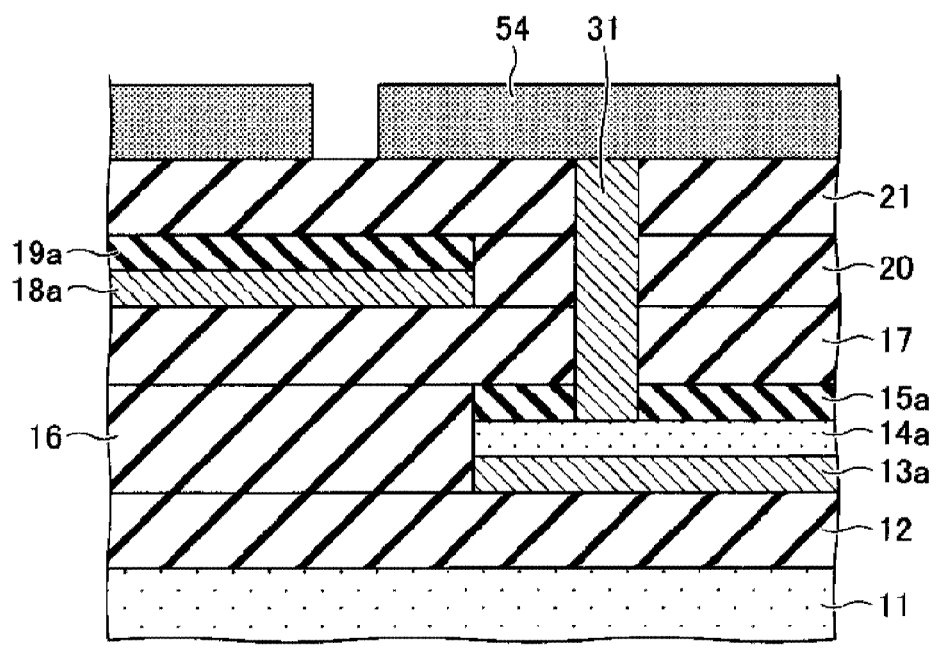

Next, as shown in FIGS. 11A to 11D, a resist pattern 54 is formed on the fifth insulating layer 21. Specifically, a photoresist is applied to the surface of the fifth insulating layer 21, and exposed and developed by an exposing device to form the resist pattern 54. The resist pattern 54 serves to form a connection electrode 32 to be described later. FIG. 11A is a top view in the process, FIG. 11B is a sectional view taken along alternating long and short dashed line 11XA-11XB, FIG. 11C is a sectional view taken along alternating long and short dashed line 11YA-11YB, and FIG. 11D is a sectional view taken along alternating long and short dashed line 11AA-11BB.

Figure 12A:
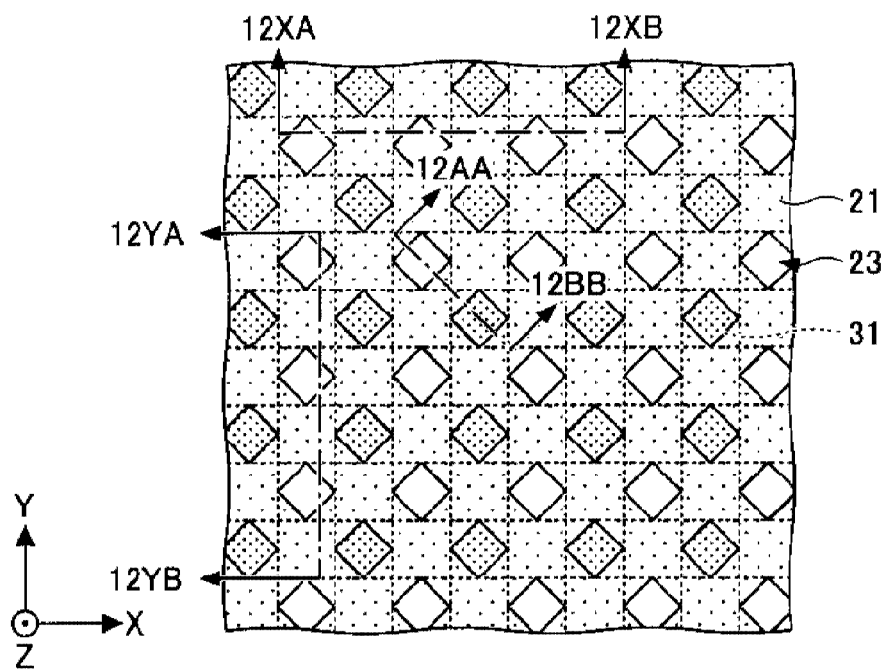
FIGS. 12A to 12D are views showing process (12) of a method for fabricating a phase change memory according to the first embodiment.
Figure 12B:
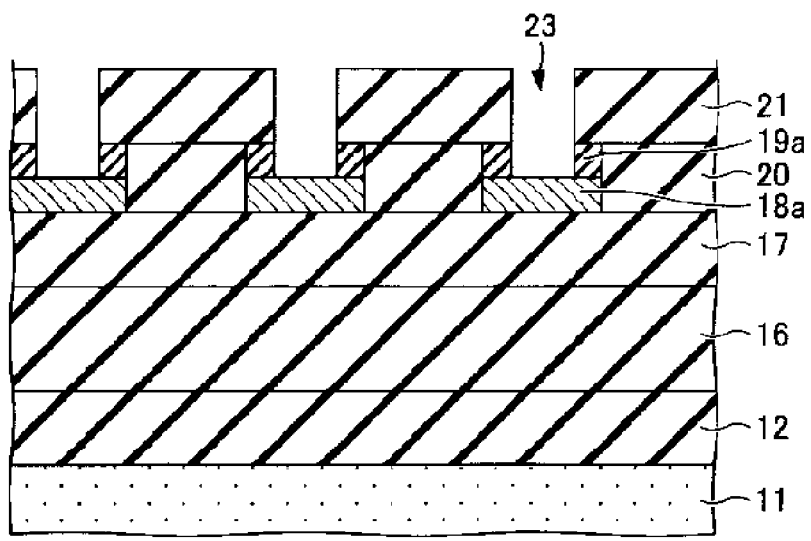
Figure 12C:
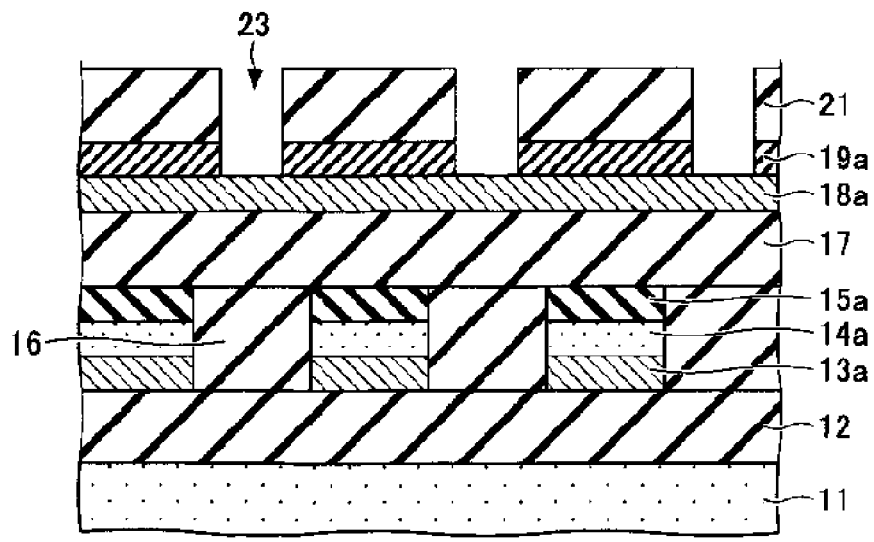
Figure 12D:
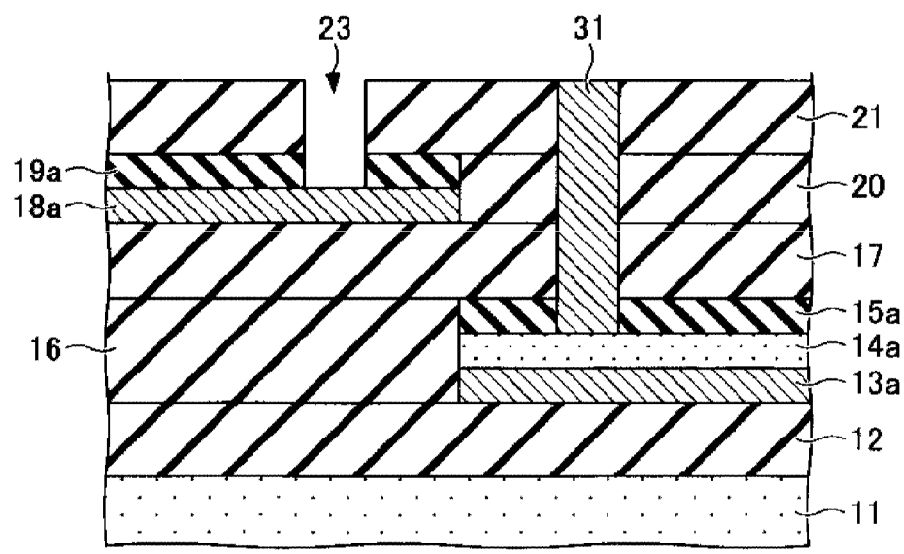

Next, as shown in FIGS. 12A to 12D, the fifth insulating layer 21 and the SiN layer 19a at a region where the resist pattern 54 is not formed are removed through etching, such as RIE, to form an opening portion 23. The etching, by RIE or the like, is performed until the surface of the upper electrode layer 18a is exposed. Thereafter, the resist pattern 54 is removed by an organic solvent or the like. FIG. 12A is a top view in the process, FIG. 12B is a sectional view taken along alternating long and short dashed line 12XA-12XB, FIG. 12C is a sectional view taken along alternating long and short dashed line 12YA-12YB, and FIG. 12D is a sectional view taken along alternating long and short dashed line 12AA-12BB.

Figure 13A:
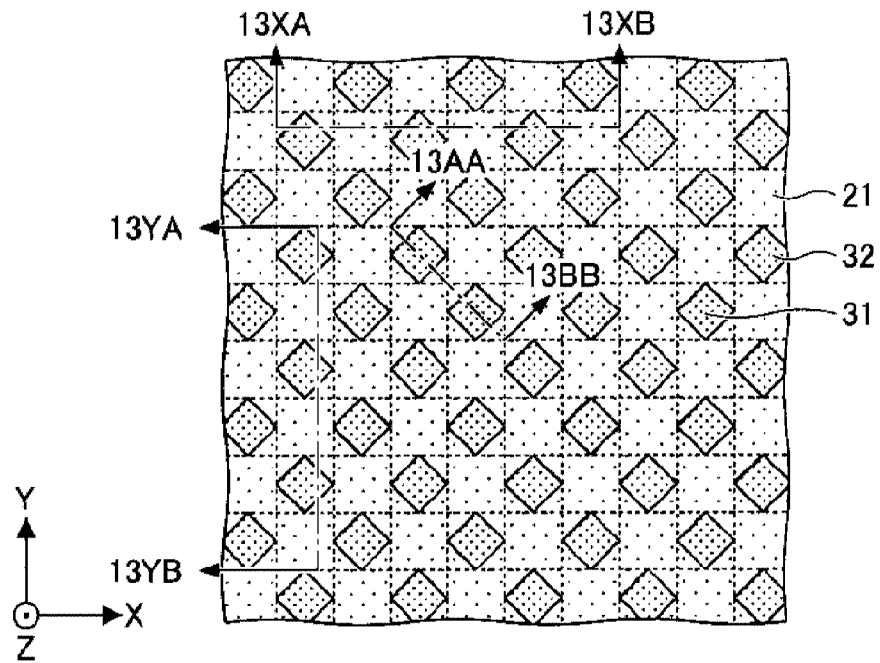
FIGS. 13A to 13D are views showing process (13) of a method for fabricating a phase change memory according to the first embodiment.
Figure 13B:
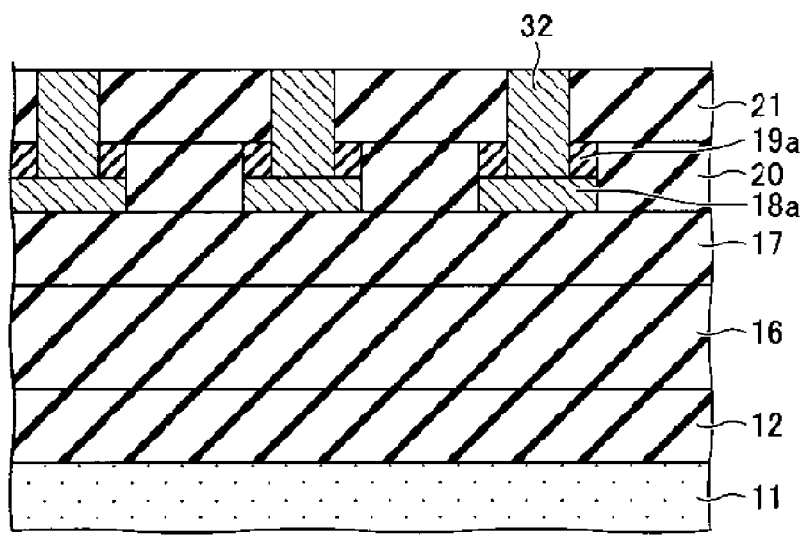
Figure 13C:
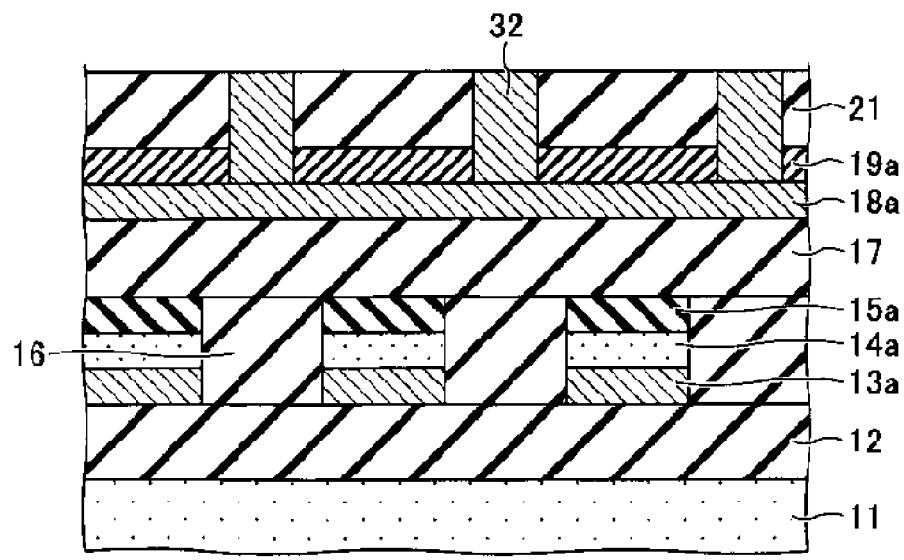
Figure 13D:
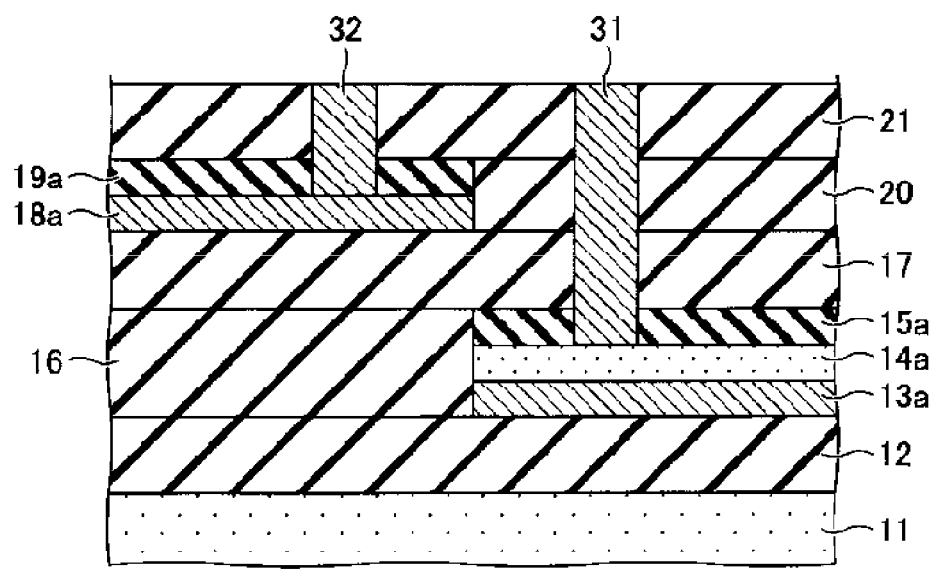

Next, as shown in FIGS. 13A to 13D, the connection electrode 32 is formed within the opening portion 23. Specifically, a film made of TiN or W is formed on the surface where the opening portion 23 is formed through CVD or the like. TiN or W is deposited on the surface of the fifth insulating layer 21 and, at the same time, is buried within the opening portion 23. Thereafter, CMP or the like is performed to remove the film made of TiN or W on the surface of the fifth insulating layer 21 to thereby form the connection electrode 32 by the TiN or W buried within the opening portion 23. FIG. 13A is a top view in the process, FIG. 13B is a sectional view taken along alternating long and short dashed line 13XA-13XB, FIG. 13C is a sectional view taken along alternating long and short dashed line 13YA-13YB, and FIG. 13D is a sectional view taken along alternating long and short dashed line 13AA-13BB.

Figure 14A:
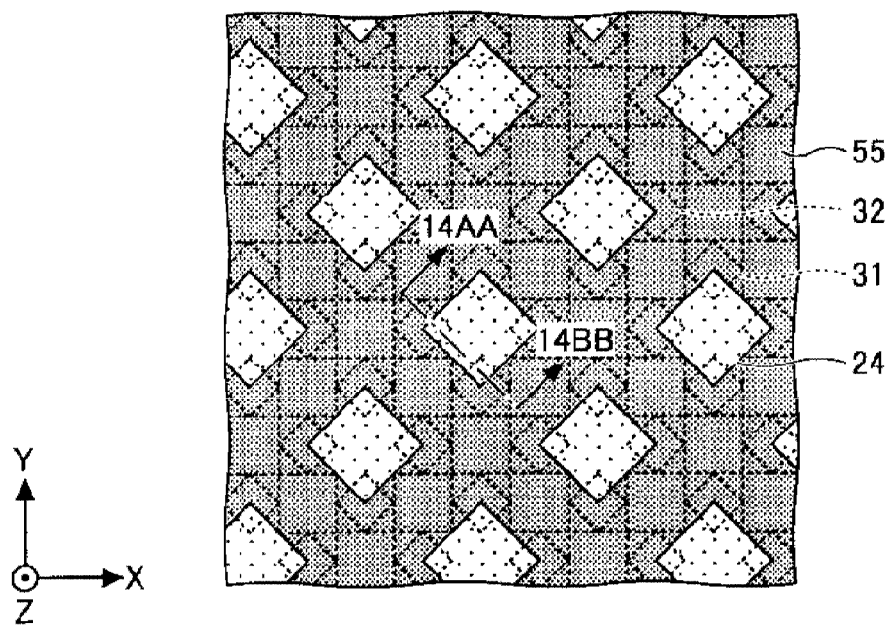
FIGS. 14A and 14B are views showing process (14) of a method for fabricating a phase change memory according to the first embodiment.
Figure 14B:
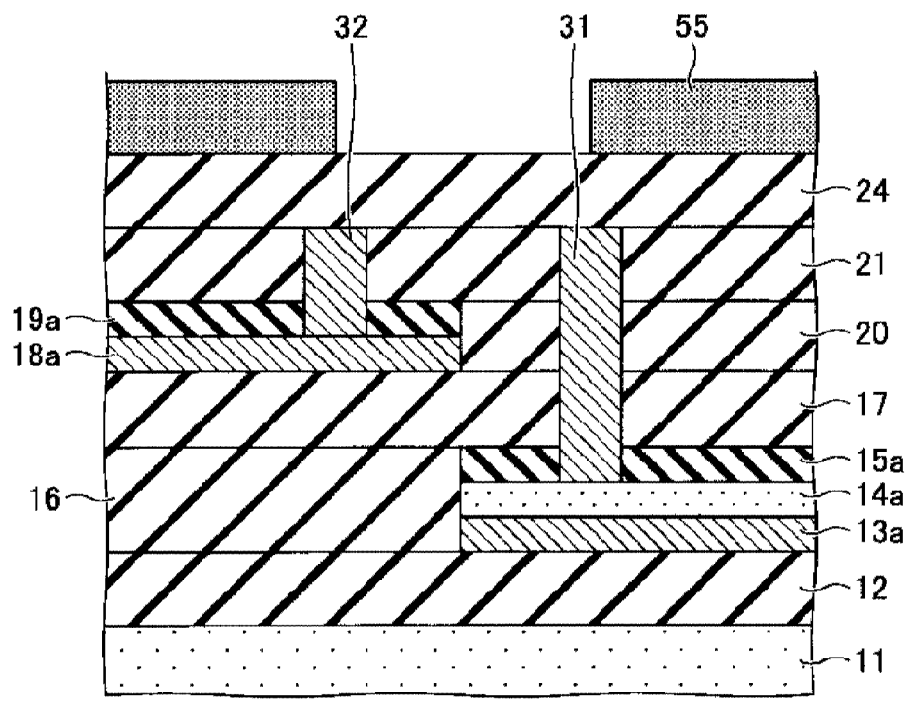

Next, as shown in FIGS. 14A and 14B, a sixth insulating layer 24 and a resist pattern 55 are formed. Specifically, the sixth insulating layer 24 made of TEOS or the like is formed on an overall region where the fifth insulating layer 21 and the connection electrodes 31 and 32 are formed. Thereafter, a photoresist is applied to the surface of the sixth insulating layer 24, and exposed and developed by an exposing device to form the resist pattern 55. The resist pattern 55 serves to form an opening portion 25 for a phase change portion 33 to be described later. FIG. 14A is a top view in the process and FIG. 14B is a sectional view taken along alternating long and short dashed line 14AA-14BB.

Figure 15A:
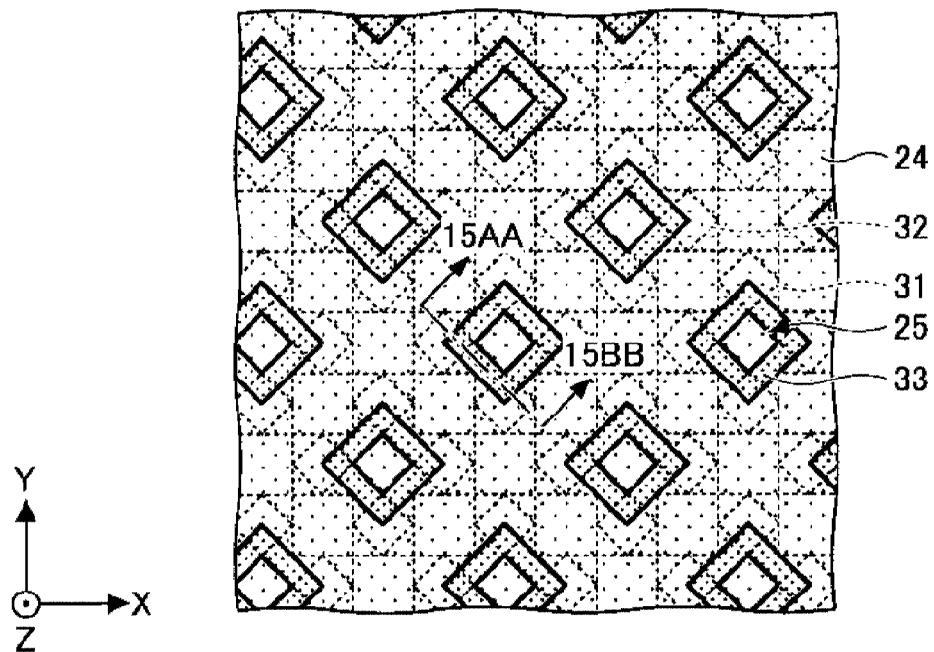
FIGS. 15A and 15B are views showing process (15) of a method for fabricating a phase change memory according to the first embodiment.
Figure 15B:
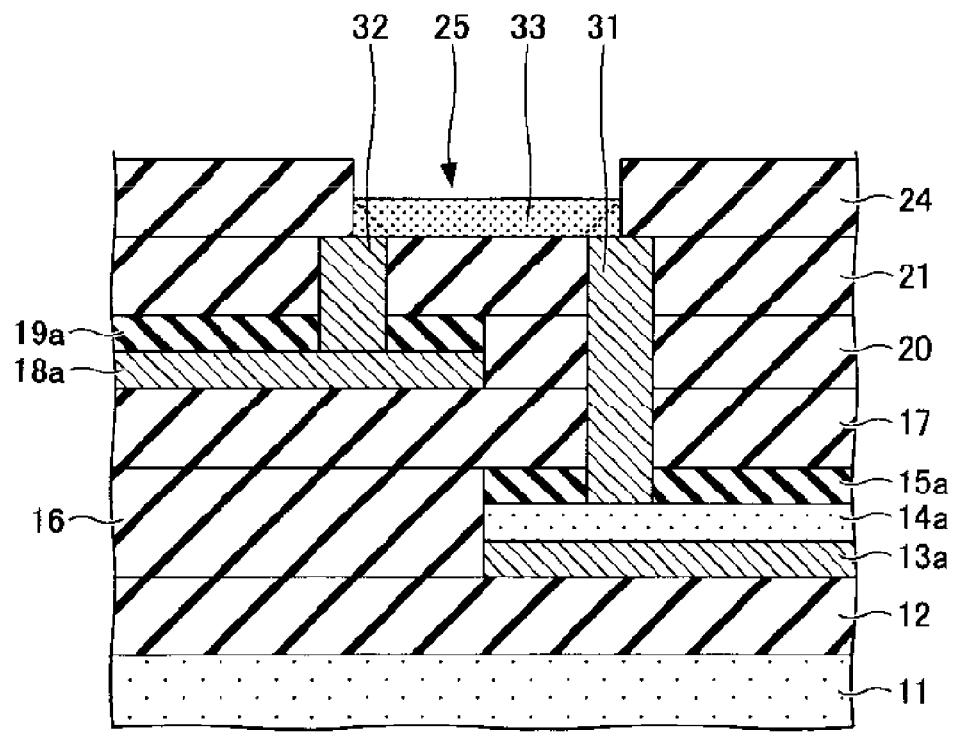

Next, as shown in FIGS. 15A and 15B, the opening portion 25 is formed, and the phase change portion 33 is formed within the opening portion 25. Specifically, the sixth insulating layer 24 at a region where the resist pattern 55 is not formed is removed through RIE or the like to form the opening portion 25 and to expose parts of the connection electrodes 31 and 32. A lower surface of the opening portion 25 has a substantially square shape. The sides of the substantially square shape of the lower surface of the opening portion 25 are at an angle of about 45 degrees with respect to a direction in which the lower electrode layer 13a extends and are at an angle of about 45 degrees with respect to a direction in which the upper electrode layer 18a extends. Thereafter, the resist pattern 55 is removed by an organic solvent or the like, a GeSbTe film is formed through sputtering, and then, the GeSbTe film is etched back through RIE or the like. Here, since the GeSbTe film is formed to be thick in the vicinity of a wall face of the sixth insulating layer 24, after etching back, the GeSbTe film remains in the vicinity of a wall face of the sixth insulating layer 24. Furthermore, in etching back the GeSbTe film, an etching rate in the vicinity of the wall face of the sixth insulating layer 24 may be slow. Thus, like in the case where a side wall is formed, the GeSbTe film only remains along the sides connecting the corners of the opening portion 25 having a substantially square shape, and the phase change portion 33 is formed by the GeSbTe film. FIG. 15A is a top view in the process and FIG. 15B is a sectional view taken along alternating long and short dashed line 15AA-15BB.

Figure 16:
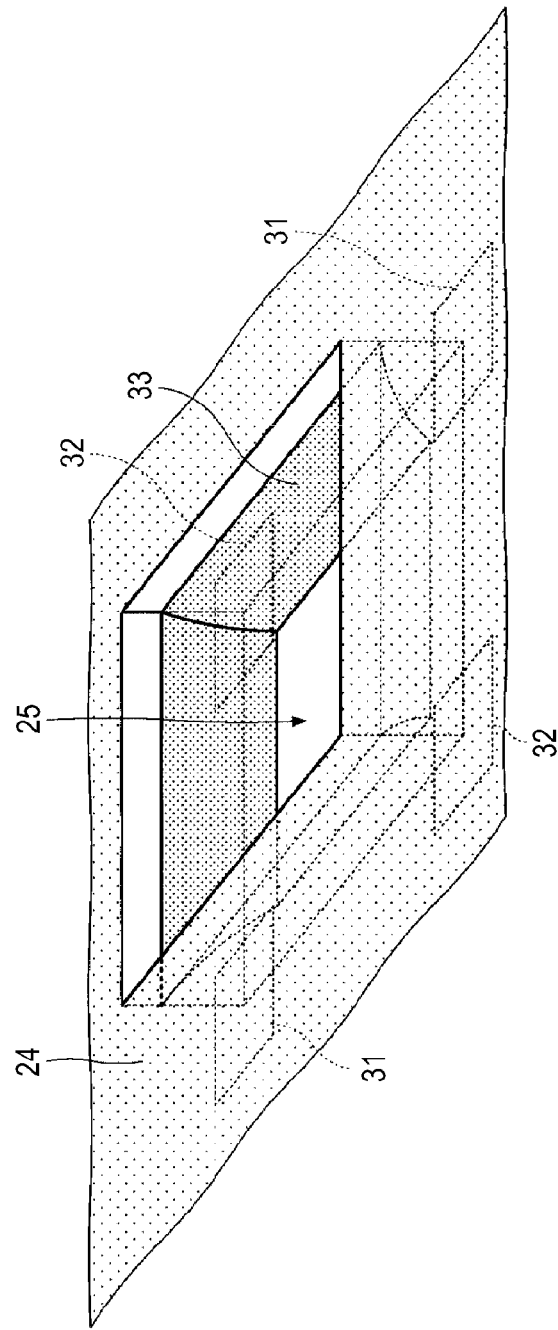
FIG. 16 is a perspective view of a phase change portion of the phase change memory according to the first embodiment.

As shown in FIG. 16, the connection electrodes 31 and the connection electrodes 32 are connected by the formed phase change portion 33. That is, two connection electrodes 31 and two connection electrodes 32 are formed at the four corners of the opening portion 25, and each connection electrode 31 and connection electrode 32 are connected by forming a phase change portion 33 therebetween. Thus, four phase change portions 33 are formed along the four sides of the lower surface of the opening portion 25, and each of the four phase change portions 33 forms a single storage element. That is, in the phase change memory according to the present embodiment, four storage elements are formed in a single opening portion 25.

In the method for fabricating a phase change memory according to the present embodiment, since the GeSbTe film forming the phase change portion 33 can be formed through sputtering, a phase change memory having high reliability can be obtained at low cost. That is, a GeSbTe film having high reliability can be obtained since a phase change material such as GeSbTe is excellent when it is formed by sputtering. Further, compared to CVD, ALD, or the like, sputtering may be used to form a film at low cost, and since an organic metallic material is not used as a raw material, C or the like included in the organic metallic material is not mixed in the GeSbTe film.

Through the foregoing process, the phase change memory according to the present embodiment can be fabricated. Preferably, an insulation film is formed on the phase change portion 33 by passivation or the like.

<Phase Change Memory>

Figure 17:
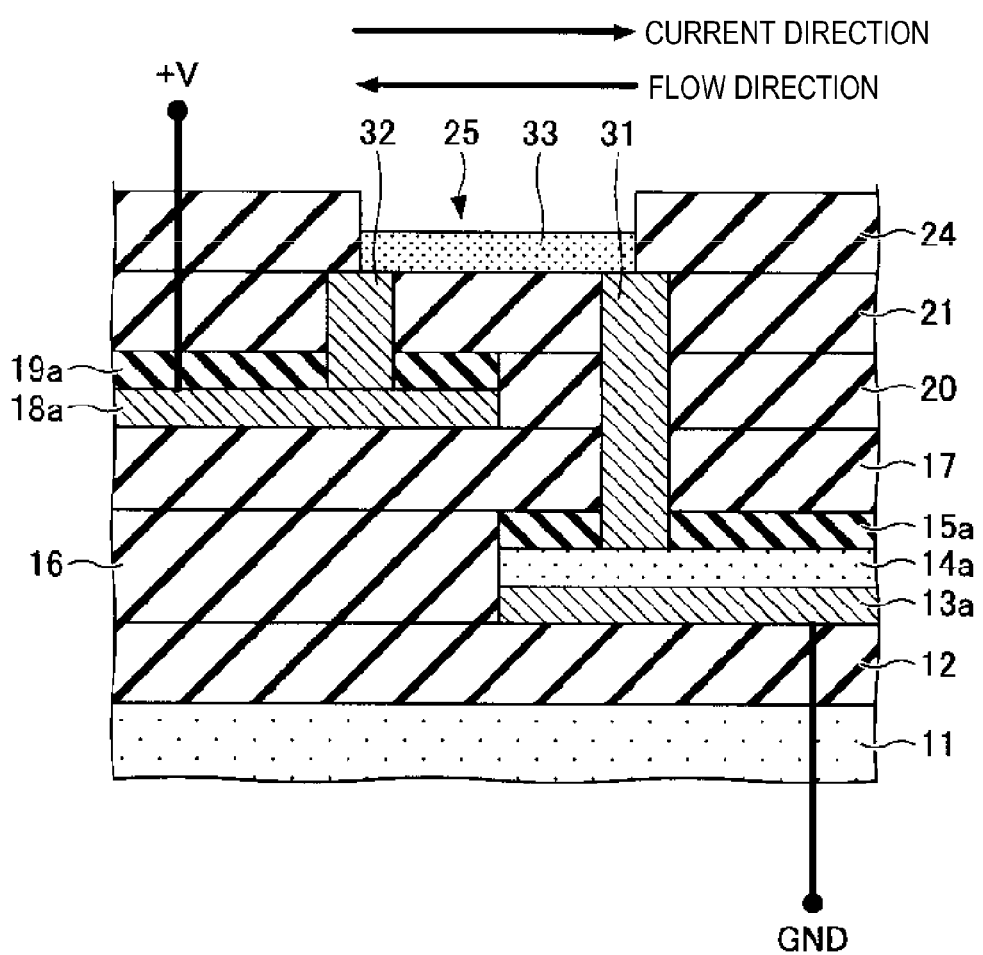
FIG. 17 is a view showing the structure of the phase change memory according to the first embodiment.
Figure 18:
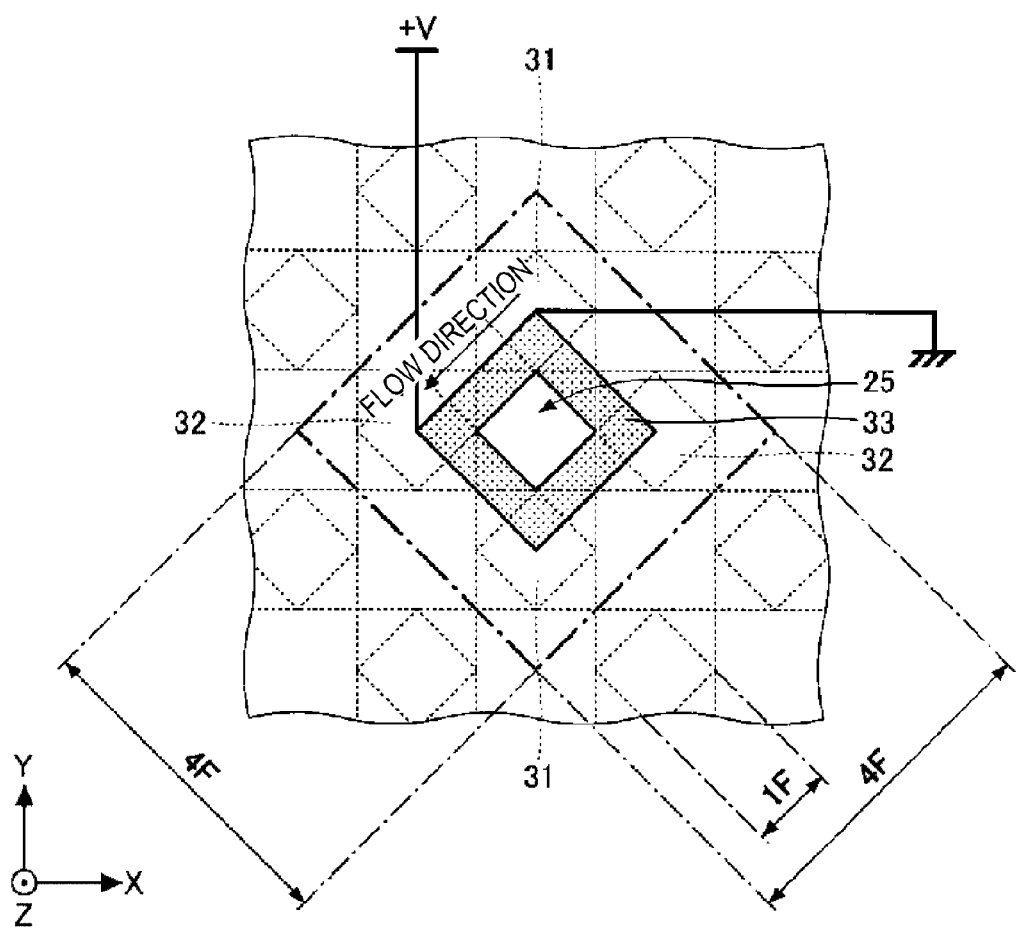
FIG. 18 is a view showing a surface of the phase change memory according to the first embodiment.

Next, the phase change memory according to the present embodiment will be described. As shown in FIGS. 17 and 18, the phase change memory according to the present embodiment is fabricated through the foregoing fabrication method. Further, interlayer insulating films are formed by the first insulating layer 12, the second insulating layer 16, the third insulating layer 17, the fourth insulating layer 20, the fifth insulating layer 21, the sixth insulating layer 24, and the like.

In the phase change memory according to the present embodiment, the first insulating layer 12 is formed on the substrate 11 constituted of a semiconductor substrate such as silicon, and the lower electrode layer 13a, the diode layer 14a, and the SiN layer 15a are formed on the first insulating layer 12. At a region where the lower electrode layer 13a is not formed, the second insulating layer 16 is formed, and the third insulating layer 17 is formed on the SiN layer 15a and the second insulating layer 16. The upper electrode 18a and the SiN layer 19a are formed on the third insulating layer 17. At a region where the upper electrode layer 18a is not formed, the fourth insulating layer 20 is formed, and the fifth insulating layer 21 is formed on the SiN layer 19a and the fourth insulating layer 20. FIG. 17 shows a section cut at an angle of about 45 degrees with respect to the X-axis and the Y-axis.

The connection electrode 31 connected to the diode layer 14a is formed to be substantially perpendicular to the surface of the substrate 11, and the connection electrode 32 connected to the upper electrode layer 18a is formed to be substantially perpendicular to the surface of the substrate 11. The connection electrode 31 is formed within the opening portion 25 formed by removing a part of the fifth insulating layer 21, the fourth insulating layer 20, the third insulating layer 17, and the SiN layer 15a in a direction substantially perpendicular to the surface of the substrate 11, and the connection electrode 32 is formed within the opening portion 25 formed by removing a part of the fifth insulating layer 21 and the SiN layer 19a in a direction substantially perpendicular to the surface of the substrate 11.

The sixth insulating layer 24 having the opening portion 25 is formed on the fifth insulating layer 21. The opening portion 25 is formed to have a substantially square shape, and parts of the two connection electrodes 31 and parts of the two connection electrodes 32 are exposed at the four corners of the opening portion 25. Further, the phase change portion 33 is formed along the four sides of the opening portion 25 having the substantially square shape. The phase change portion 33 is formed to be substantially parallel to the surface of the substrate 11, and the connection electrode 31 and the connection electrode 32 are formed to be connected by the phase change portion 33. Since the phase change portion 33 between one connection electrode 31 and one connection electrode 32 forms a single storage element, four storage elements are formed within the opening portion 25. When the width of the region where the connection electrodes 31 and 32 are formed is determined to be a minimum line width 1F limited by an exposing device or the like, four storage elements are formed at every region of 4F×4F. Thus, since $(4F)^2/4$ bit=$4F^2$/bit, the area of the region occupied per 1 bit is $4F^2$.

In the phase change memory according to the present embodiment, writing of information may be performed by an amount of current flowing through the phase change portion 33. That is, a phase change material forming the phase change portion 33 has different resistance values in an amorphous state and in a crystalline state, and these states of the phase change material can be change by the amount of current flowing through the phase change portion 33. Specifically, the lower electrode layer 13a is grounded and a certain voltage is applied to the upper electrode layer 18a to allow a current to flow to the phase change portion 33. As the current flows to the phase change portion 33, the phase change portion 33 is heated to have a high temperature. By controlling the temperature or the like, the phase change portion 33 can be changed into an amorphous state or a crystalline state. In general, by heating to a high temperature and then rapidly cooling the phase change portion 33, the phase change portion 33 can be changed into an amorphous state, and by heating to a high temperature and then slowly cooling, the phase change portion 33 can be changed into a crystalline state. Thus, the phase change portion 33 can be changed into desired crystal state by an increasing temperature or time. GeSbTe is generally used as the phase change material, but AgInSbTe or the like may also be used.

Figure 19A:
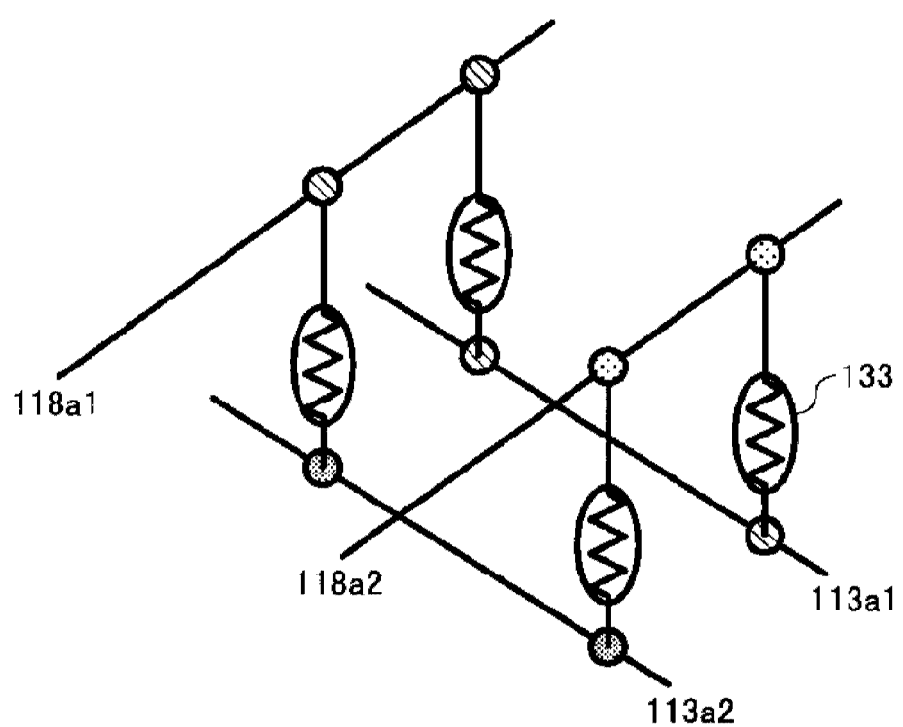
FIGS. 19A to 19B are views for explaining the phase change memory according to the first embodiment.
Figure 19B:
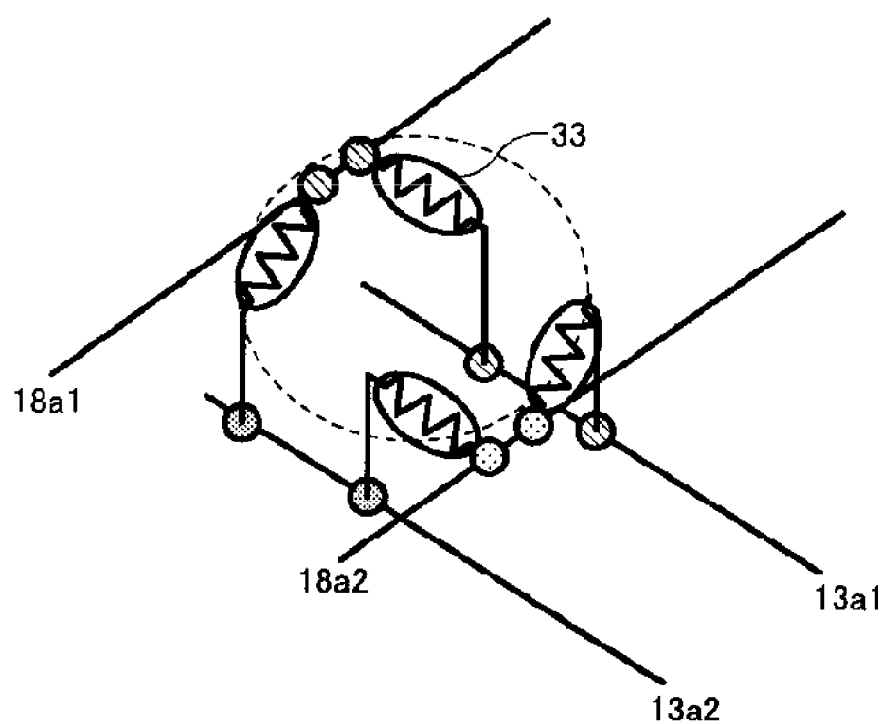

Further, the phase change portion 33 in the phase change memory according to the present embodiment is formed to be substantially parallel to the surface of the substrate 11. However, it is identical in terms of topology to the related art structure as shown in the conceptual view of FIG. 19A, that is, between lower electrodes 113a1 and 113a2 and upper electrodes 118a1 and 118a2 and in which the phase change portion 133 is formed to be perpendicular to the surface of the substrate. FIG. 19B is a conceptual view of the phase change memory according to the present embodiment. Lower electrodes 13a1 and 13a2 are parts of the lower electrode layer 13a, and upper electrodes 18a1 and 18a2 are parts of the upper electrode layer 18a. As mentioned above, the area of the region occupied per 1 bit in the phase change memory according to the present embodiment is $4F^2$, and the area is not likely to be larger in comparison to the related art phase change memory illustrated in FIG. 19A.

Second Embodiment

Next, a second embodiment of the present disclosure will be described. This embodiment relates to a method for fabricating a phase change memory and the processes thereof are the same as the processes up to FIG. 10 in the first embodiment. Therefore, the processes of the second embodiment after FIG. 10 will be described.

Figure 20A:
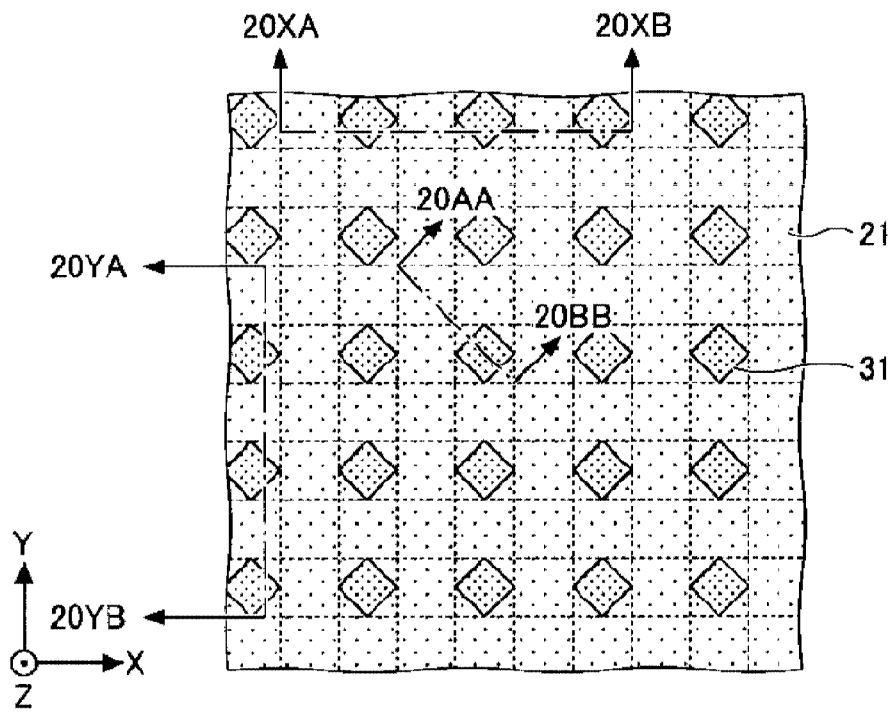
FIGS. 20A to 20D are views showing process (1) of a method for fabricating a phase change memory according to a second embodiment of the present disclosure.
Figure 20B:
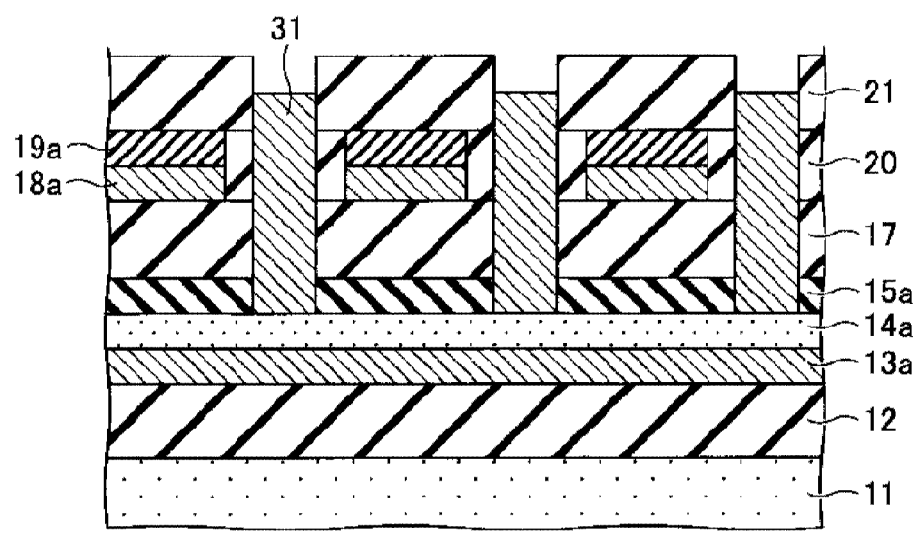
Figure 20C:
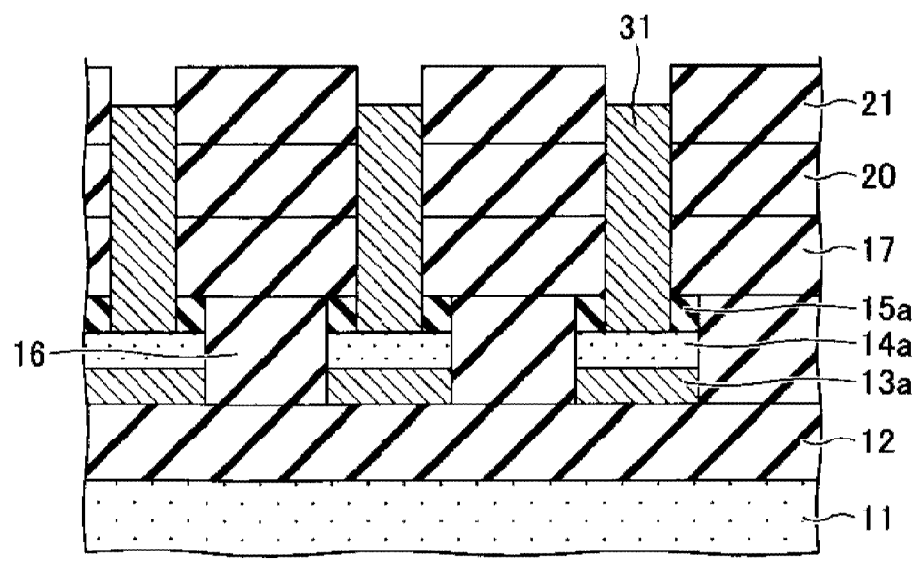
Figure 20D:
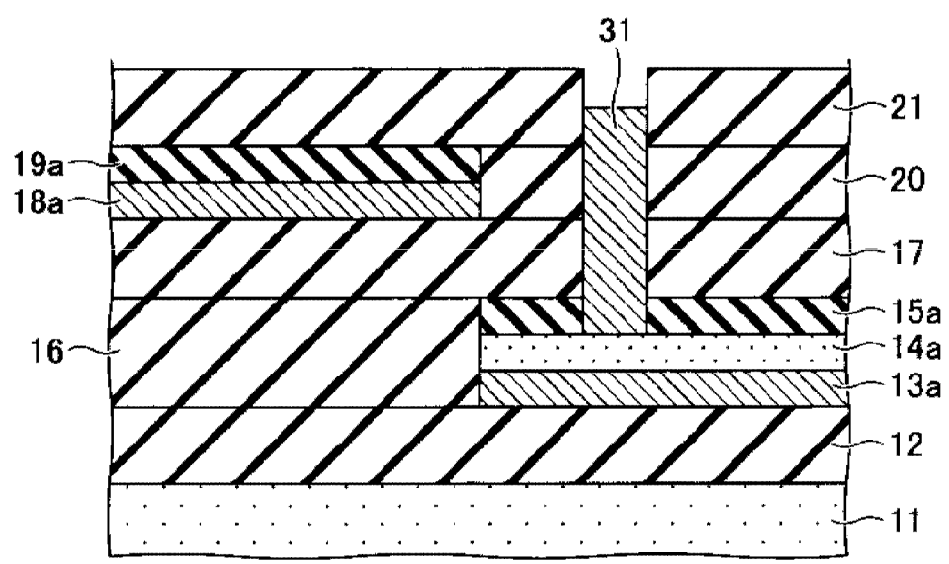

After the formation up to FIG. 10, as shown in FIGS. 20A to 20D, etching back is performed on the connection electrode 31. Specifically, by an etching method in which only TiN, W, or the like can be selectively etched, a part of the surface of the connection electrode 31 is removed. FIG. 20A is a top view in the process, FIG. 20B is a sectional view taken along alternating long and short dashed line 20XA-20XB, FIG. 20C is a sectional view taken along alternating long and short dashed line 20YA-20YB, and FIG. 20D is a sectional view taken along alternating long and short dashed line 20AA-20BB.

Figure 21A:
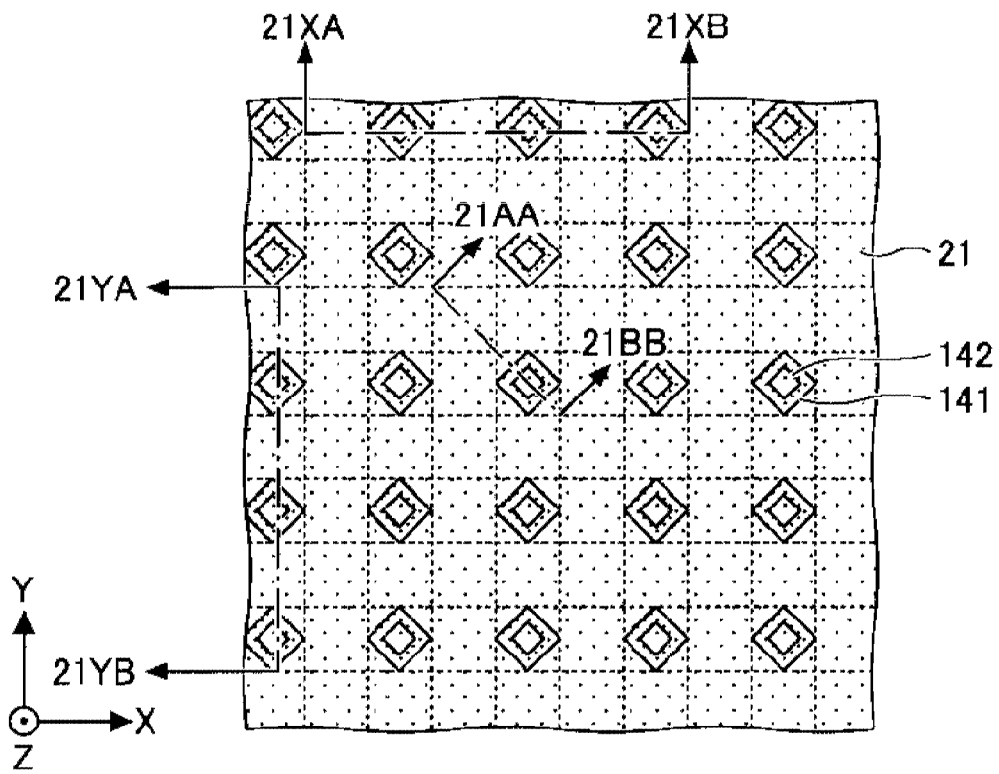
FIGS. 21A to 21D are views showing process (2) of a method for fabricating a phase change memory according to the second embodiment.
Figure 21B:
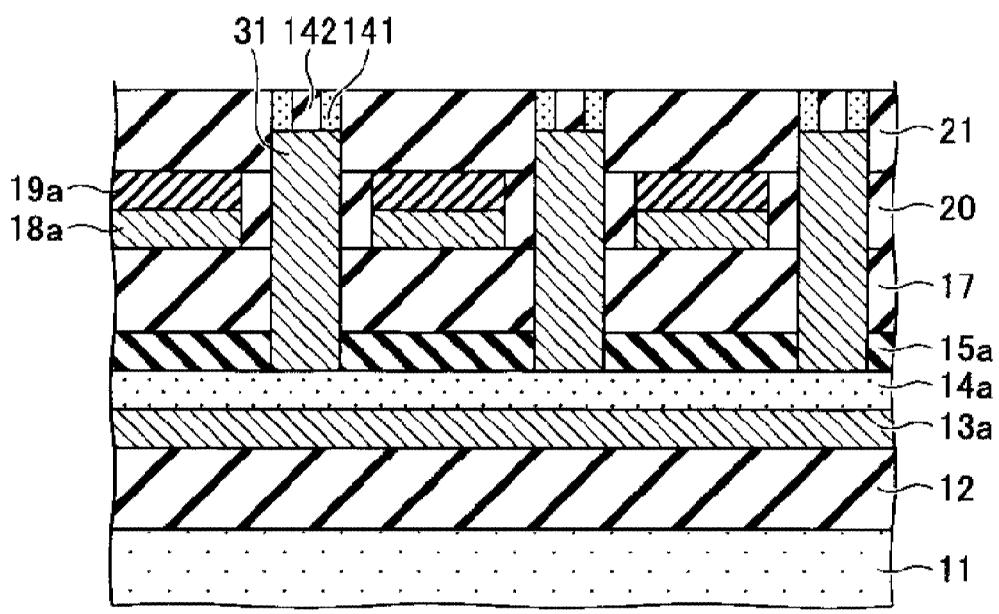
Figure 21C:
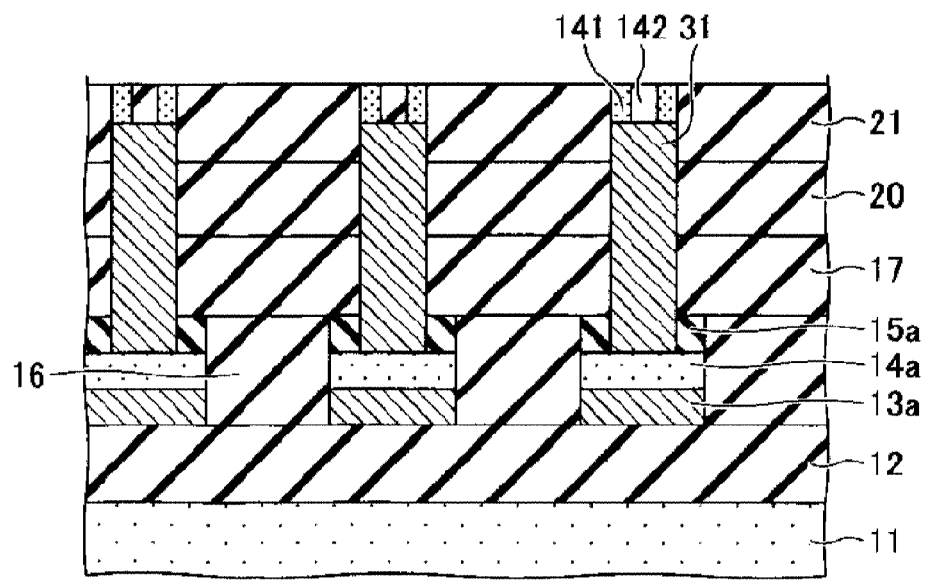
Figure 21D:
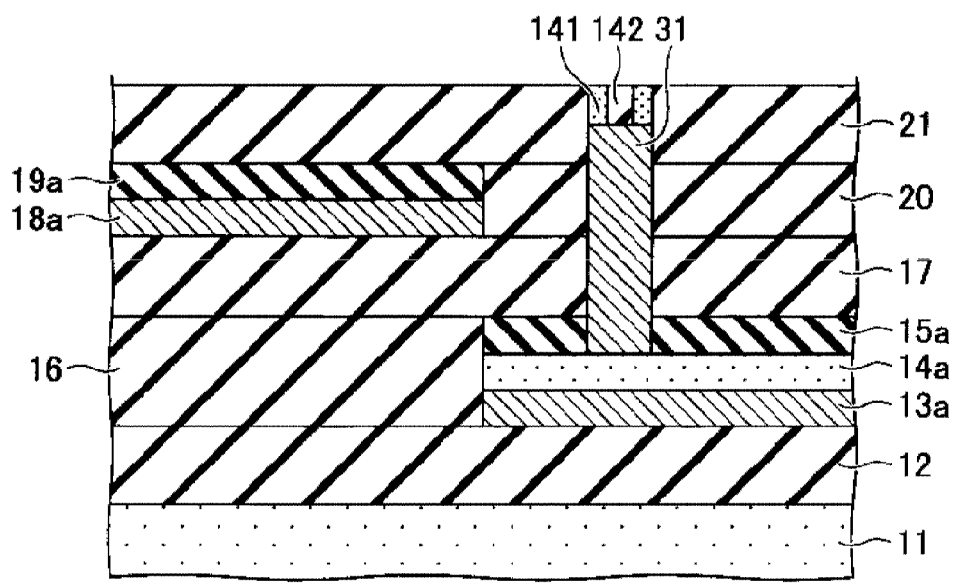

Next, as shown in FIGS. 21A to 21D, at the region where the connection electrode 31 is etched back, a conductive portion 141 is formed along the wall face of an opening portion 22, and a seventh insulating layer 142 is formed at a central part of the opening portion 22. Specifically, a conductive film made of TiN or the like is formed through CVD at the region where the connection electrode 31 is etched back, and an insulating film is formed thereon. The conductive film and the insulating film are also formed on the surface of the fifth insulating layer 21, in addition to the region where the connection electrode 31 is etched back. Thereafter, the conductive film and the insulating film that are formed on the surface of the fifth insulating layer 21 are removed through polishing by CMP, and the conductive portion 141 formed of a conductive film and the seventh insulating layer 142 are formed. The formed conductive portion 141 is formed to surround the seventh insulating layer 142. Accordingly, the conductive portion 141 connected to the connection electrode 31 has a hollow prism shape. FIG. 21A is a top view in the process, FIG. 21B is a sectional view taken along alternating long and short dashed line 21XA-21XB, FIG. 21C is a sectional view taken along alternating long and short dashed line 21YA-21YB, and FIG. 21D is a sectional view taken along alternating long and short dashed line 21AA-21BB.

Figure 22A:
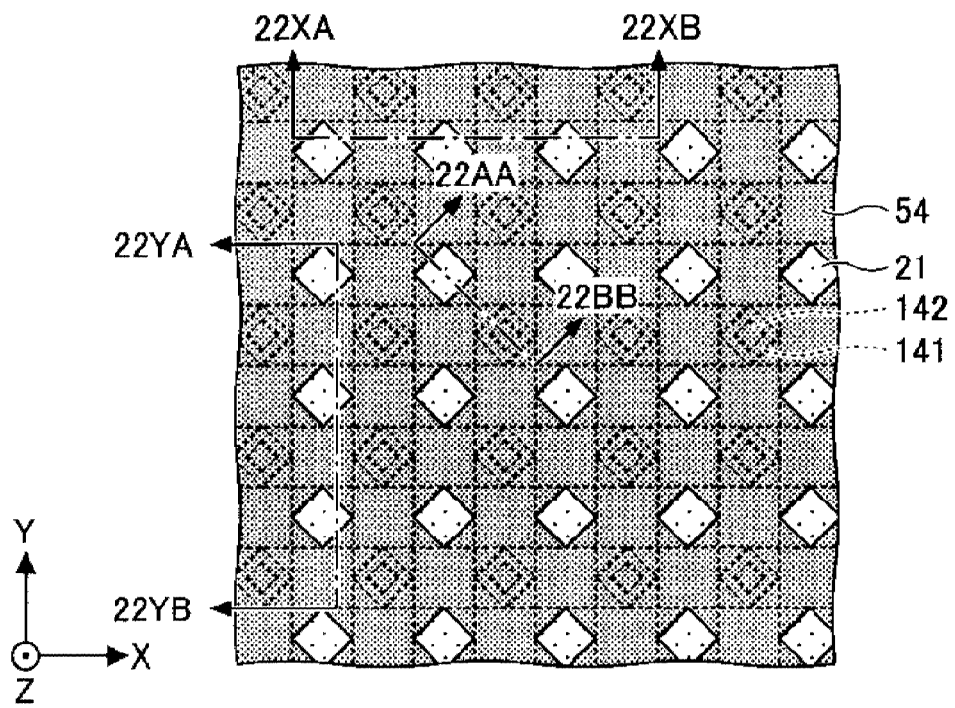
FIGS. 22A to 22D are views showing process (3) of a method for fabricating a phase change memory according to the second embodiment.
Figure 22B:
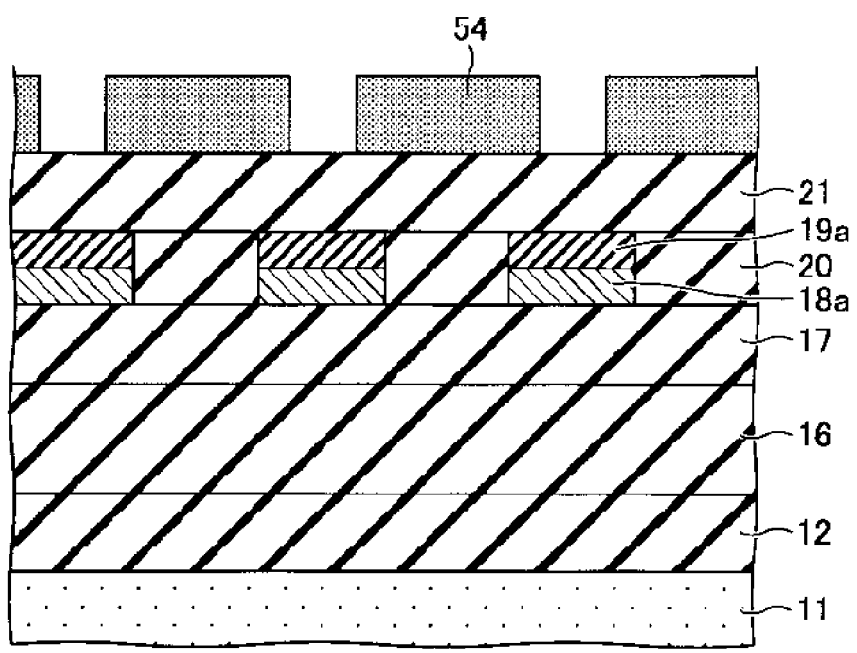
Figure 22C:
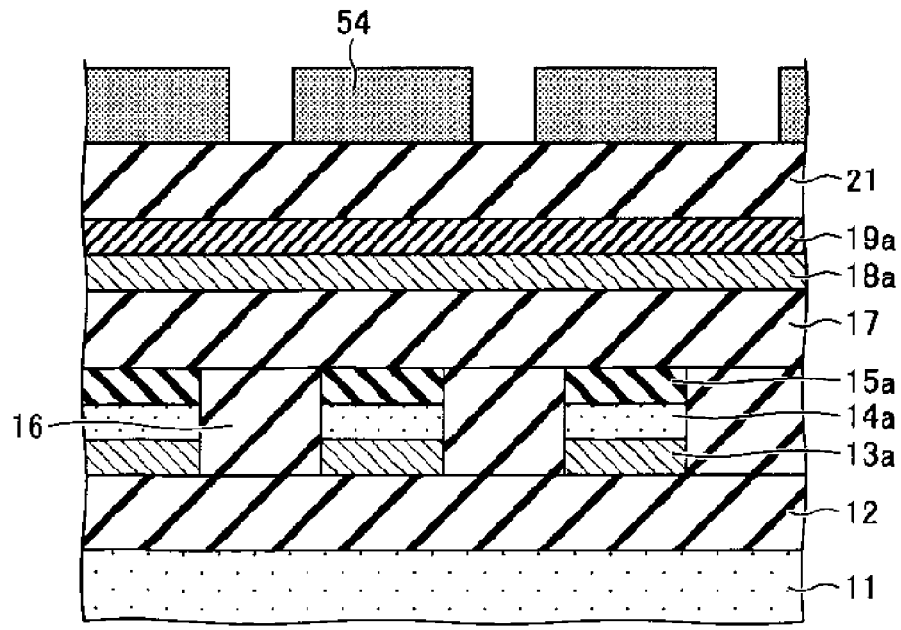
Figure 22D:
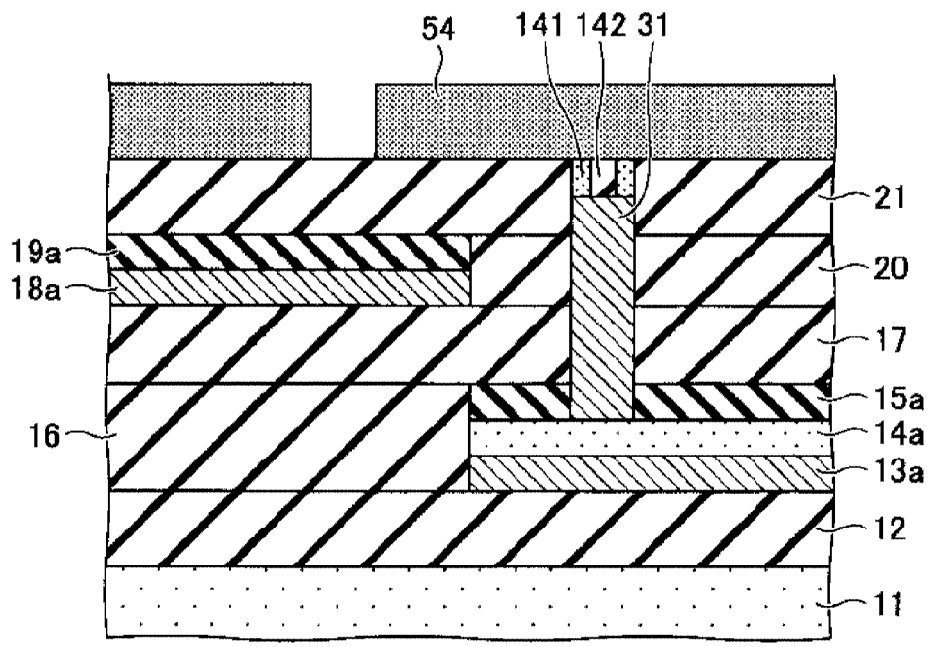

Next, as shown in FIGS. 22A to 22D, the resist pattern 54 is formed on the fifth insulating layer 21. Specifically, a photoresist is applied to the surface of the fifth insulating layer 21, and exposed and developed by an exposing device to form the resist pattern 54. The resist pattern 54 serves to form a connection electrode 32 to be described later. FIG. 22A is a top view in the process, FIG. 22B is a sectional view taken along alternating long and short dashed line 22XA-22XB, FIG. 22C is a sectional view taken along alternating long and short dashed line 22YA-22YB, and FIG. 22D is a sectional view taken along alternating long and short dashed line 22AA-22BB.

Figure 23A:
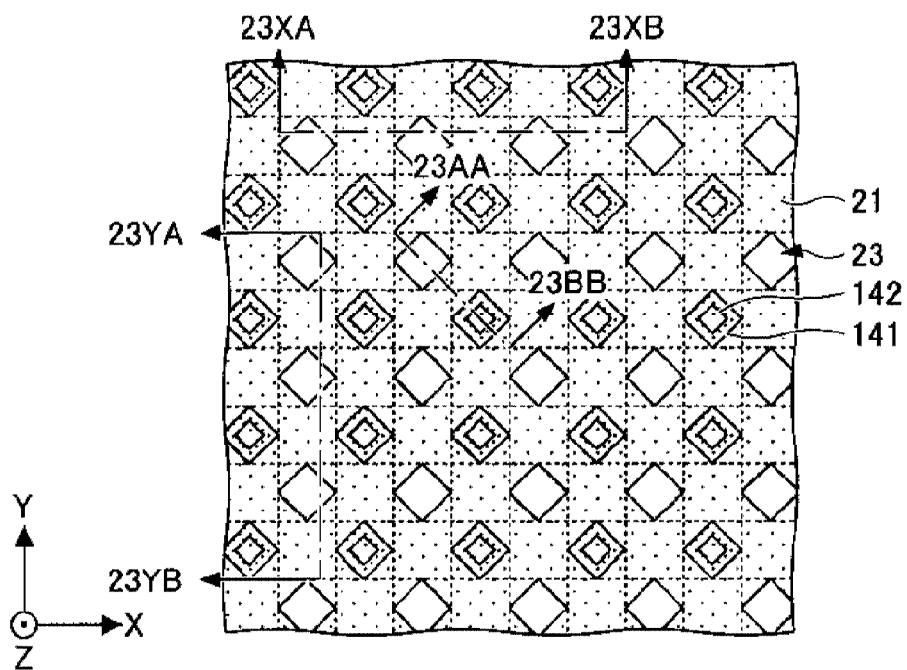
FIGS. 23A to 23D are views showing process (4) of a method for fabricating a phase change memory according to the second embodiment.
Figure 23B:
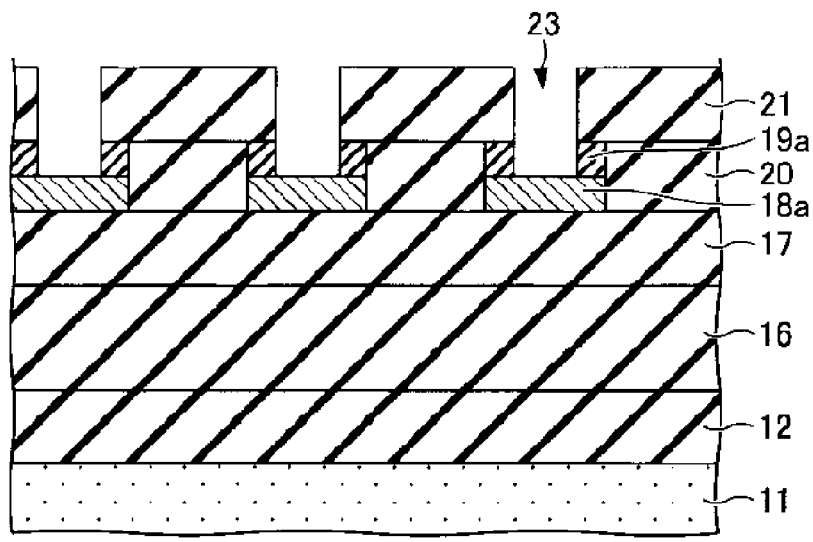
Figure 23C:
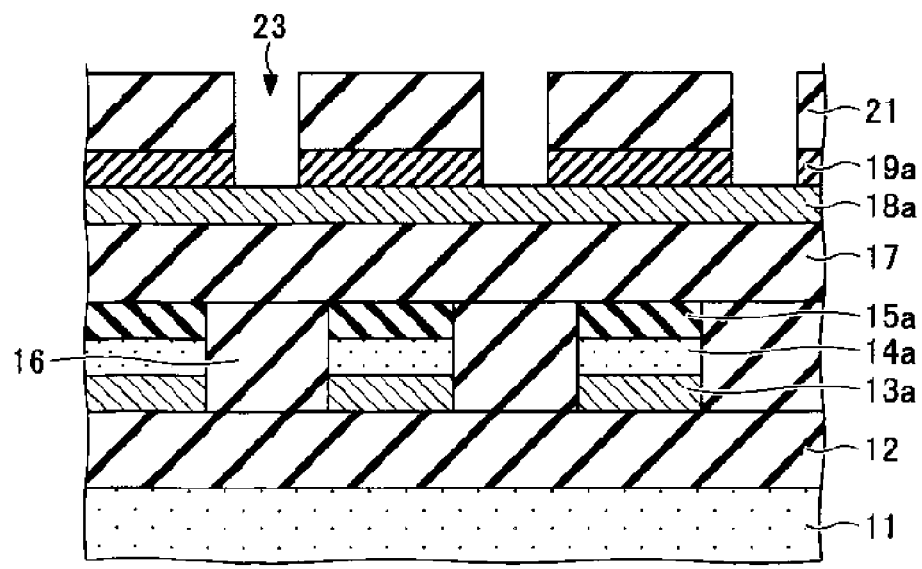
Figure 23D:
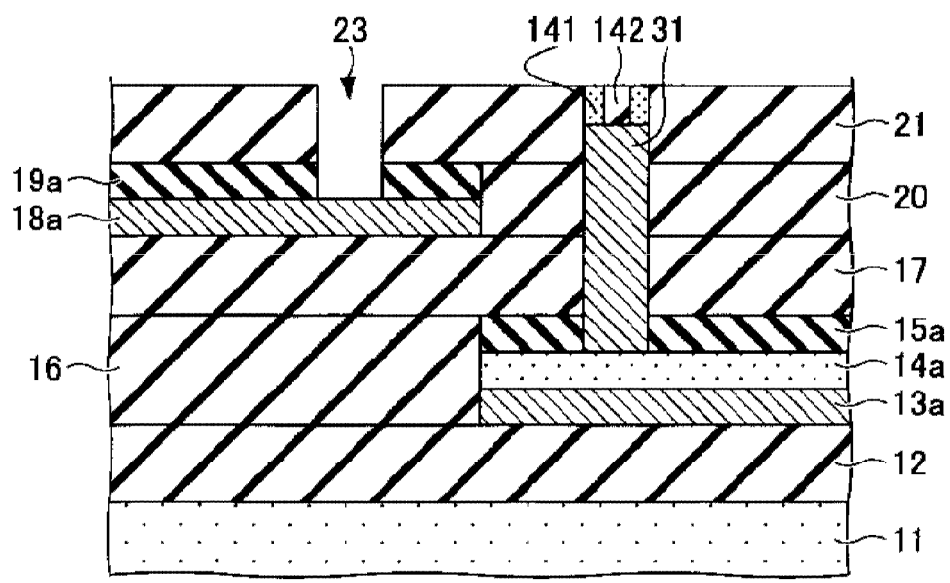

Next, as shown in FIGS. 23A to 23D, the fifth insulating layer 21 and the SiN layer 19a at a region where the resist pattern 54 is not formed are removed through etching, such as RIE, to form an opening portion 23. The etching, by RIE or the like, is performed until the surface of the upper electrode layer 18a is exposed. Thereafter, the resist pattern 54 is removed by an organic solvent or the like. FIG. 23A is a top view in the process, FIG. 23B is a sectional view taken along alternating long and short dashed line 23XA-23XB, FIG. 23C is a sectional view taken along alternating long and short dashed line 23YA-23YB, and FIG. 23D is a sectional view taken along alternating long and short dashed line 23AA-23BB.

Figure 24A:
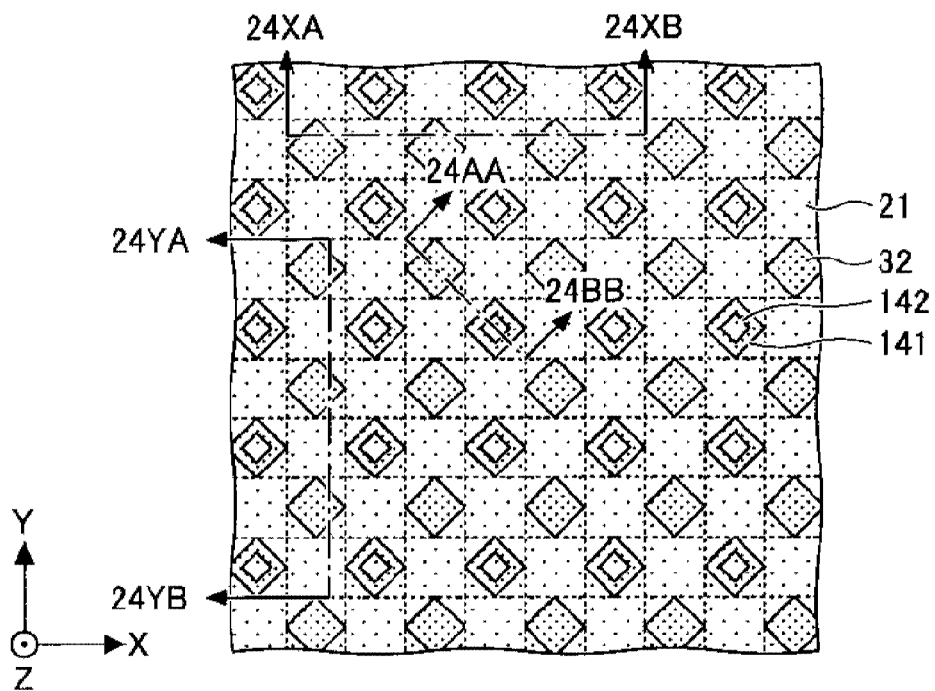
FIGS. 24A to 24D are views showing process (5) of a method for fabricating a phase change memory according to the second embodiment.
Figure 24B:
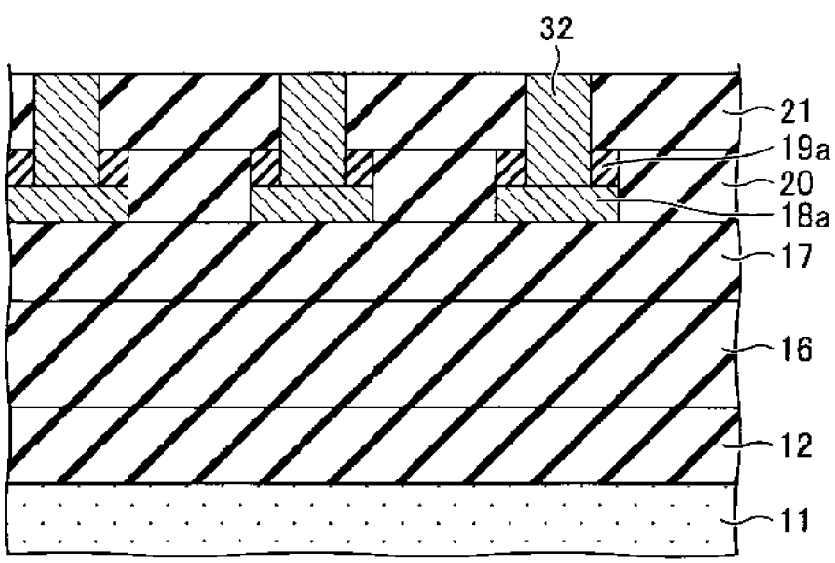
Figure 24C:
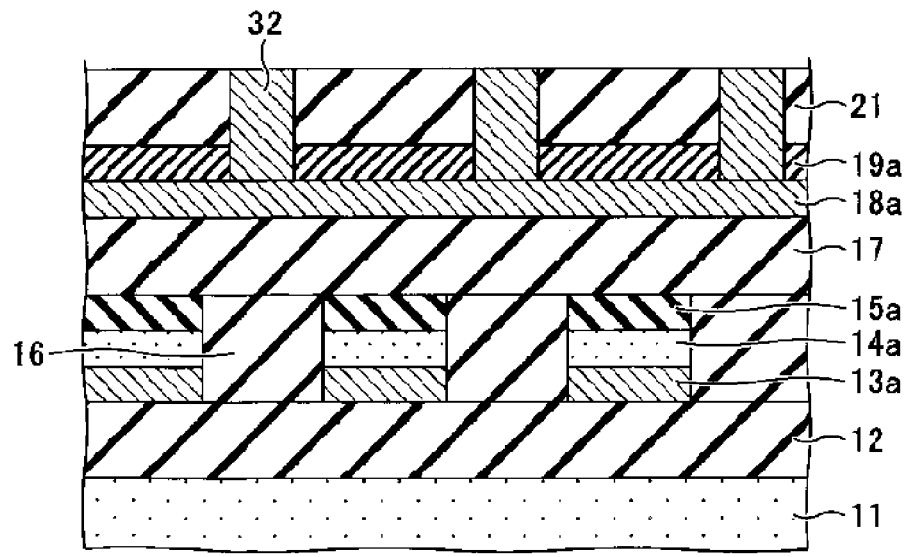
Figure 24D:
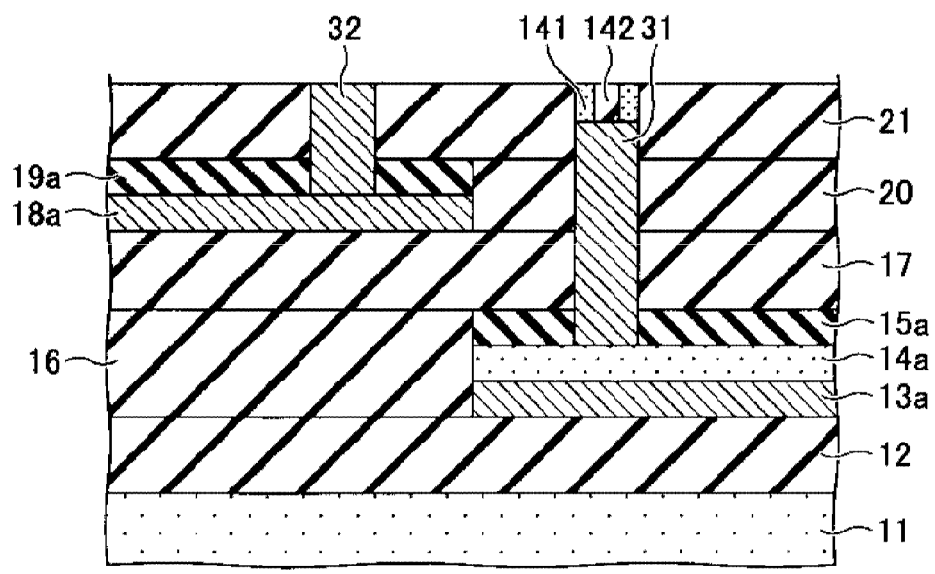

Next, as shown in FIGS. 24A to 24D, the connection electrode 32 is formed within the opening portion 23. Specifically, a film made of TiN or W is formed on the surface where the opening portion 23 is formed through CVD or the like. TiN or W is deposited on the surface of the fifth insulating layer 21 and, at the same time, is buried within the opening portion 23. Thereafter, CMP or the like is performed to remove the film made of TiN or W on the surface of the fifth insulating layer 21 to thereby form the connection electrode 32 by the TiN or W buried within the opening portion 23. FIG. 24A is a top view in the process, FIG. 24B is a sectional view taken along alternating long and short dashed line 24XA-24XB, FIG. 24C is a sectional view taken along alternating long and short dashed line 24YA-24YB, and FIG. 24D is a sectional view taken along alternating long and short dashed line 24AA-24BB.

Figure 25A:
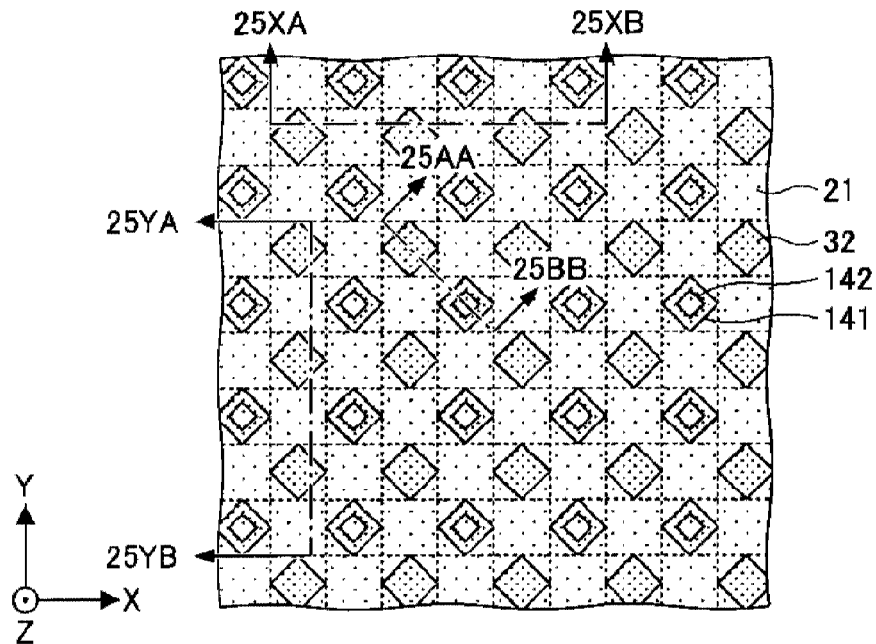
FIGS. 25A to 25D are views showing process (6) of a method for fabricating a phase change memory according to the second embodiment.
Figure 25B:
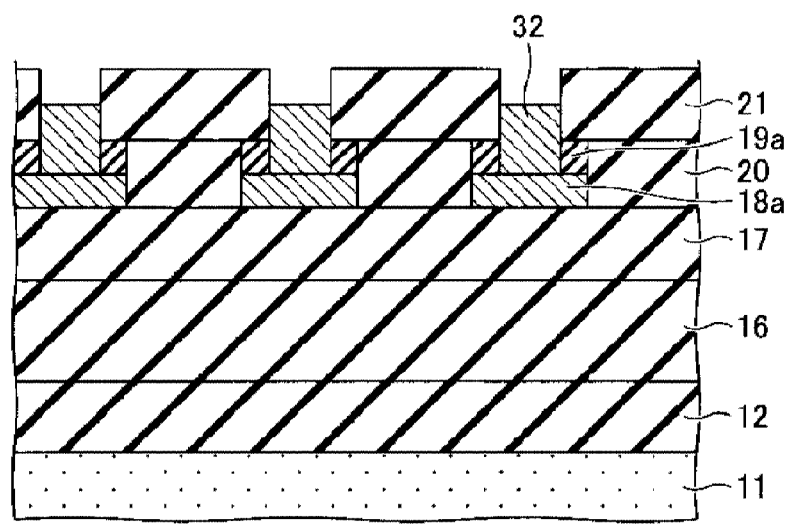
Figure 25C:
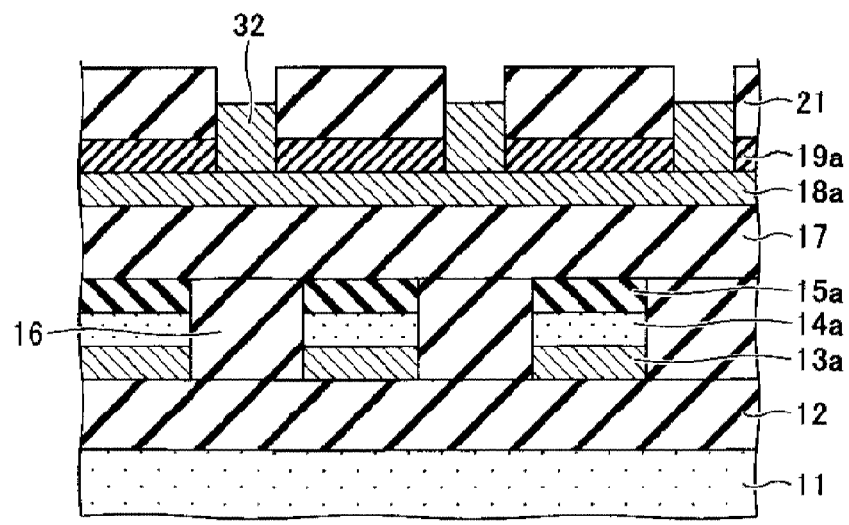
Figure 25D:
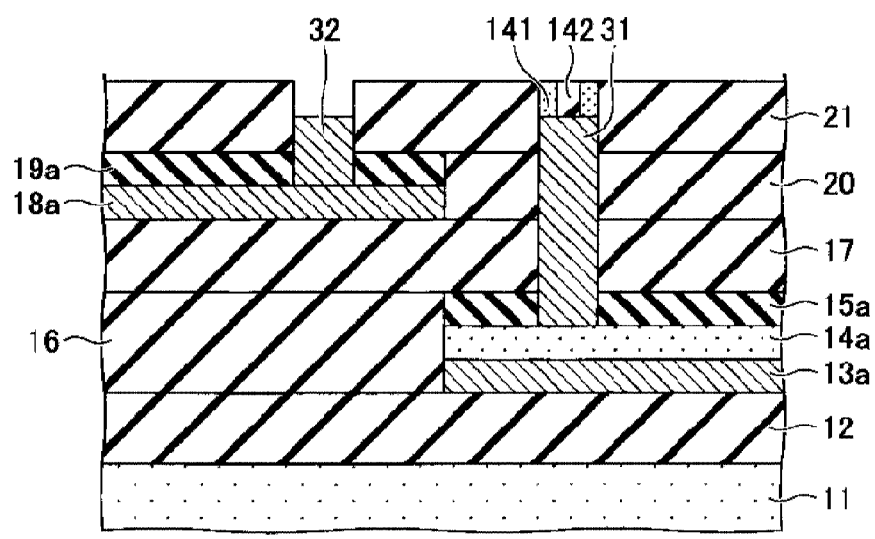

As shown in FIGS. 25A to 25D, etching back is performed on the connection electrode 32. Specifically, by an etching method in which only TiN, W, or the like can be selectively etched, a part of the surface of the connection electrode 32 is removed. FIG. 25A is a top view in the process, FIG. 25B is a sectional view taken along alternating long and short dashed line 25XA-25XB, FIG. 25C is a sectional view taken along alternating long and short dashed line 25YA-25YB, and FIG. 25D is a sectional view taken along alternating long and short dashed line 25AA-25BB.

Figure 26A:
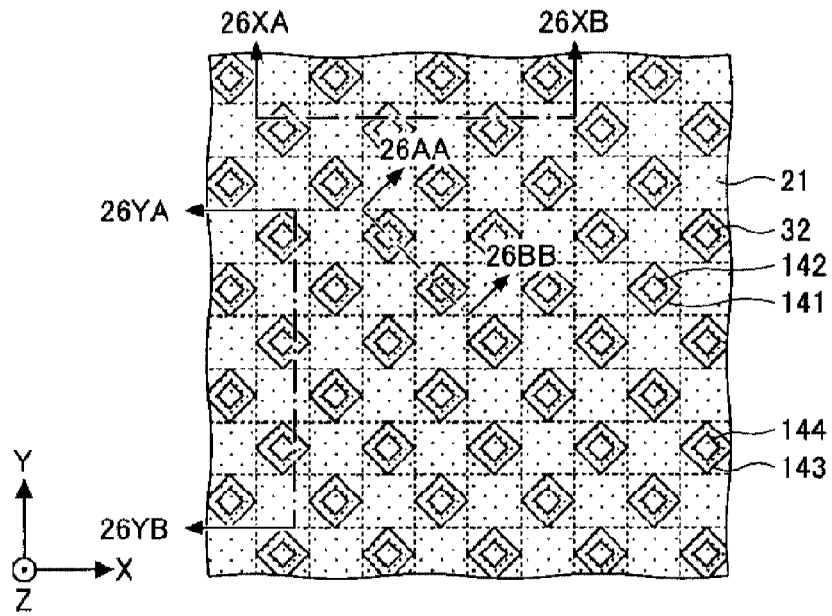
FIGS. 26A to 26D are views showing process (7) of a method for fabricating a phase change memory according to the second embodiment.
Figure 26B:
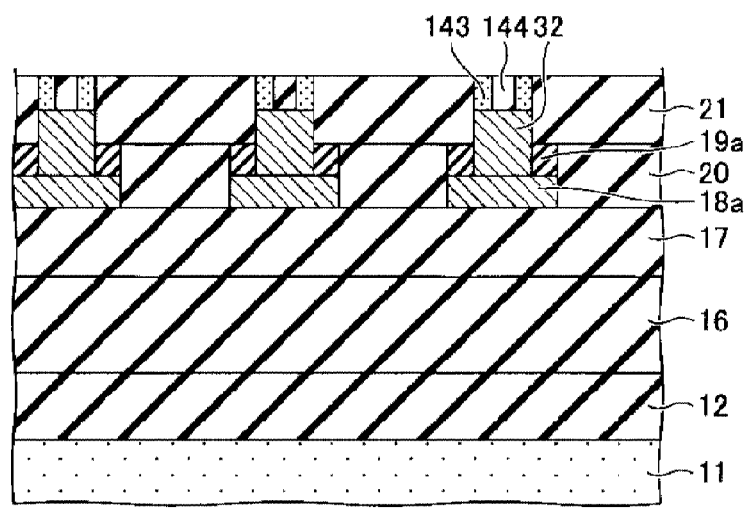
Figure 26C:
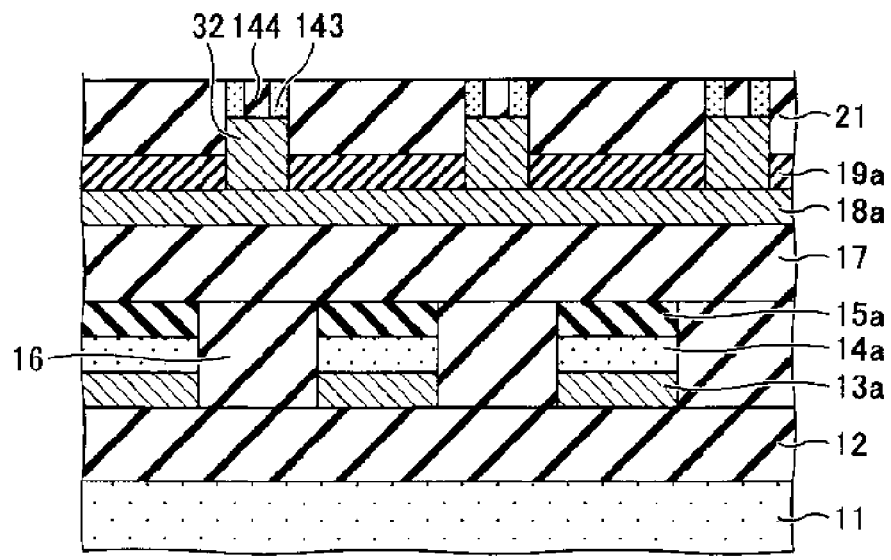
Figure 26D:
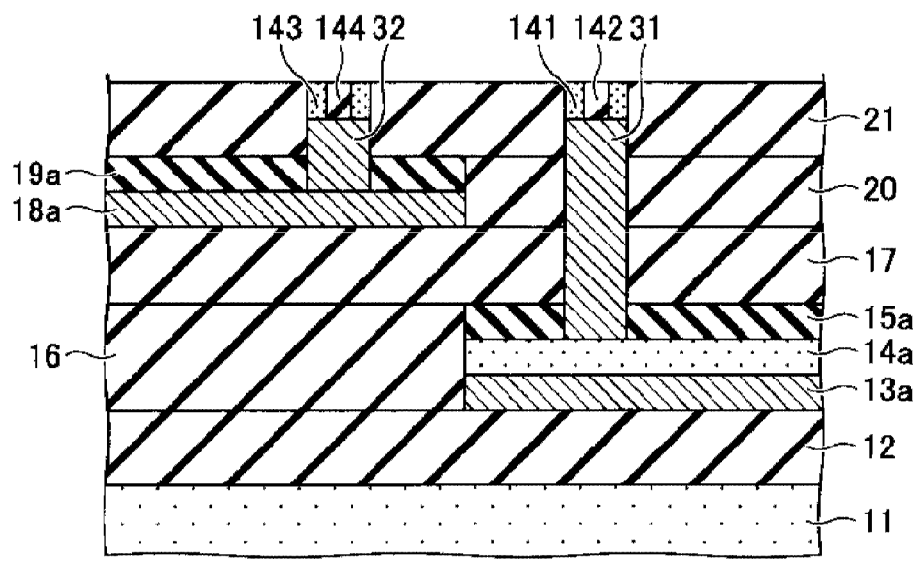

Next, as shown in FIGS. 26A to 26D, at the region where the connection electrode 32 is etched back, a conductive portion 143 is formed along the wall face of the opening portion 23, and an eighth insulating layer 144 is formed at a central part of the opening portion 23. Specifically, a conductive film made of TiN or the like is formed through CVD at the region where the connection electrode 32 is etched back, and an insulating film is formed thereon. The conductive film and the insulating film are also formed on the surface of the fifth insulating layer 21, in addition to the region where the connection electrode 32 is etched back. Thereafter, the conductive film and the insulating film that are formed on the surface of the fifth insulating layer 21 are removed through polishing by CMP, and the conductive portion 143 formed of a conductive film and the eighth insulating layer 144 are formed. The formed conductive portion 143 is formed to surround the eighth insulating layer 144. Accordingly, the conductive portion 143 connected to the connection electrode 32 has a hollow prism shape. FIG. 26A is a top view in the process, FIG. 26B is a sectional view taken along alternating long and short dashed line 26XA-26XB, FIG. 26C is a sectional view taken along alternating long and short dashed line 26YA-26YB, and FIG. 26D is a sectional view taken along alternating long and short dashed line 26AA-26BB.

Figure 27A:
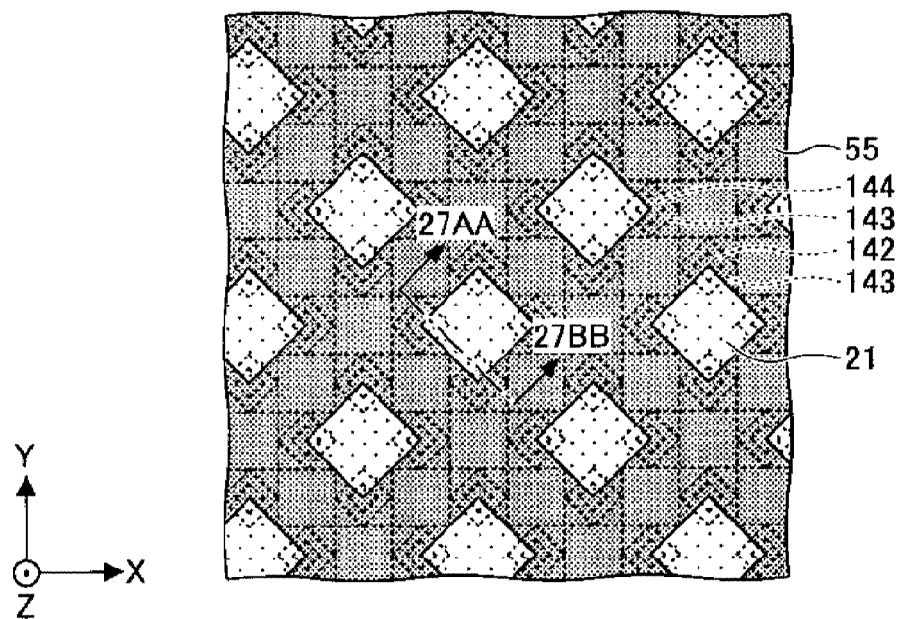
FIGS. 27A and 27B are views showing process (8) of a method for fabricating a phase change memory according to the second embodiment.
Figure 27B:
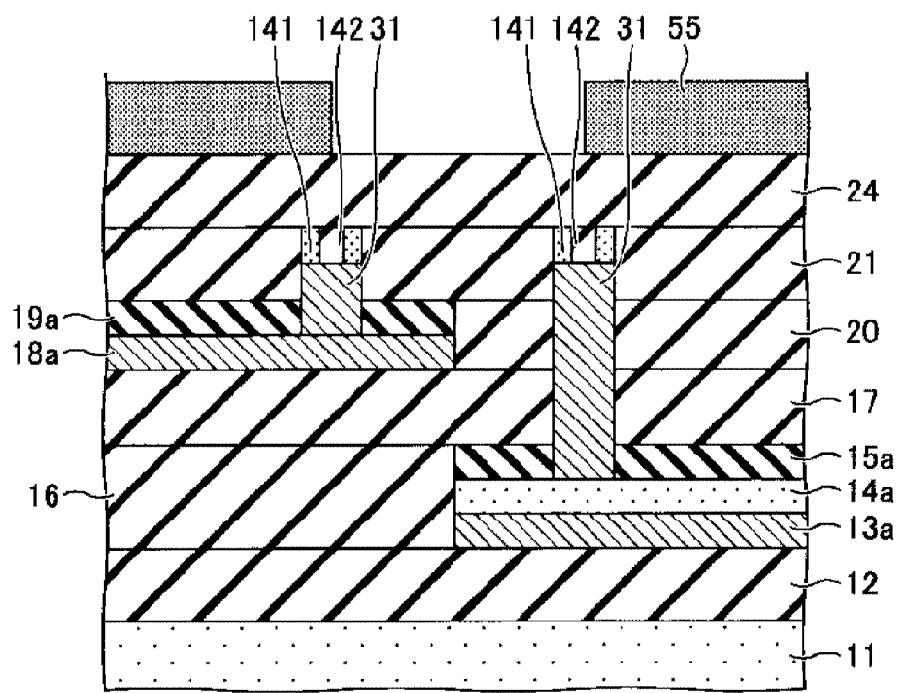

Next, as shown in FIGS. 27A to 27B, a sixth insulating layer 24 and a resist pattern 55 are formed. Specifically, the sixth insulating layer 24 made of TEOS or the like is formed on an overall region where the fifth insulating layer 21 and the like are formed. Thereafter, a photoresist is applied to the surface of the sixth insulating layer 24, and exposed and developed by an exposing device to form the resist pattern 55. The resist pattern 55 serves to form an opening portion for a phase change portion. FIG. 27A is a top view in the process and FIG. 27B is a sectional view taken along alternating long and short dashed line 27AA-27BB.

Figure 28A:
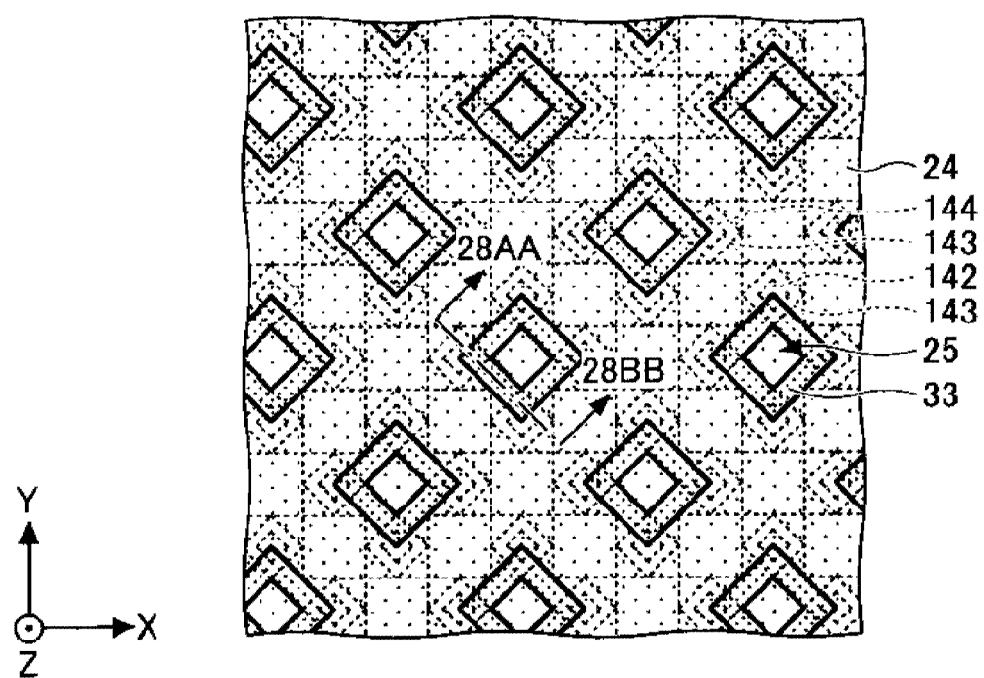
FIGS. 28A and 28B are views showing process (9) of a method for fabricating a phase change memory according to the second embodiment.
Figure 28B:
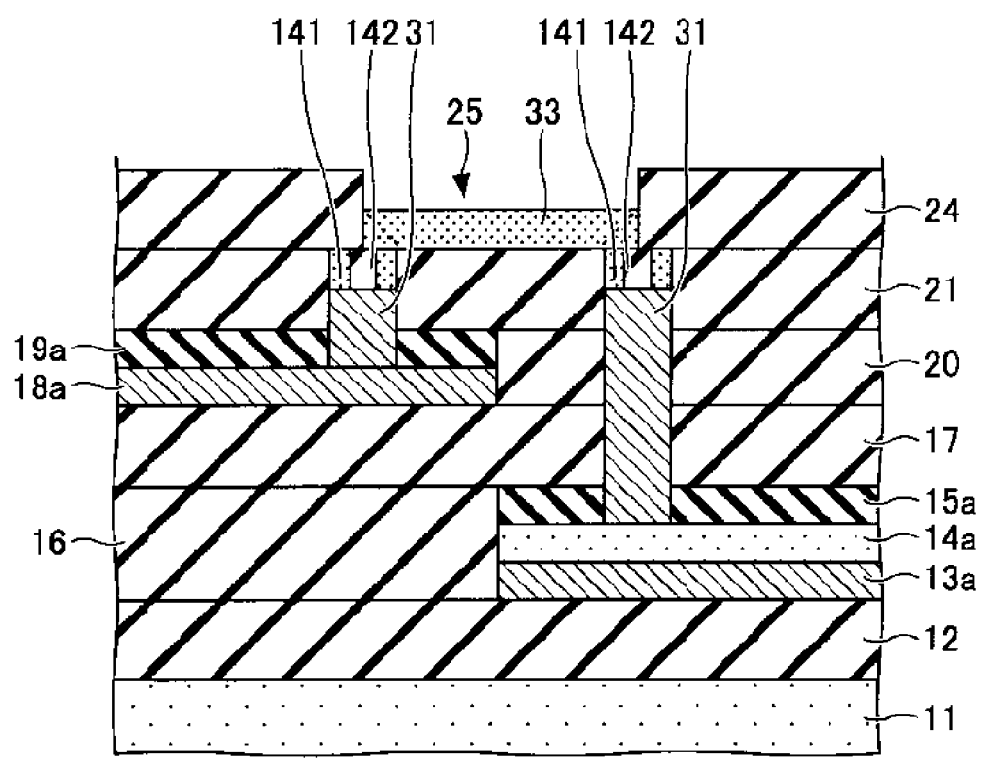

Next, as shown in FIGS. 28A to 28B, the opening portion 25 is formed, and the phase change portion 33 is formed within the opening portion 25. Specifically, the sixth insulating layer 24 at a region where the resist pattern 55 is not formed is removed through RIE or the like to form the opening portion 25 and to expose a part of the conductive portion 141 connected to the connection electrode 31 and a part of the conductive portion 143 connected to the connection electrode 32. Further, the opening portion 25 has a substantially square shape. Thereafter, the resist pattern 55 is removed by an organic solvent or the like, a GeSbTe film is formed through sputtering, and then, the GeSbTe film is etched back through RIE or the like. In etching back the GeSbTe film, an etching rate in the vicinity of the wall face of the sixth insulating layer 24 is slow. Thus, like in the case where a side wall is formed, the GeSbTe film only remains along the sides connecting the corners of the opening portion 25 having a substantially square shape, and the phase change portion 33 is formed by the GeSbTe film. FIG. 28A is a top view in the process and FIG. 28B is a sectional view taken along alternating long and short dashed line 28AA-28BB.

In the present embodiment, since the phase change portion 33 is connected to parts of the conductive portion 141 and the conductive portion 143 formed to have a hollow square prism shape at the four corners of the opening portion 25, the contact area can become further uniform and the influence of a difference or the like in alignment in forming the phase change portion 33 can be prevented as possible. Other content than in the foregoing description is the same as that of the first embodiment.

Although configurations in relation to the embodiments of the present disclosure have been described, but the foregoing content does not limit the content of the present disclosure.

According to the present disclosure, it is possible to provide a phase change memory and a method for fabricating a phase change memory having high reliability at low cost.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions, and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A phase change memory, comprising:
an insulating layer formed on a substrate;
an electrode layer having one pole and an electrode layer having another pole, both electrode layers being formed within the insulating layer;
an opening portion whose lower portion is on an upper portion of the insulating layer and having a substantially square or substantially rectangular shape;
a phase change portion formed substantially parallel to a surface of the substrate along the respective sides of the lower portion of the opening portion; and
two connection electrodes having one pole and respectively connected to the phase change portion at two corners of the lower portion of the opening portion opposite each other among four corners, and two connection electrode having another pole and respectively connected to the phase change portion at the other two corners opposite each other,
wherein the connection electrode having one pole connects a diode portion connected to the electrode layer having one pole and the phase change portion, and
the connection electrode having another pole connects the phase change portion and the electrode layer having another pole.

2. The phase change memory of claim 1, wherein the connection electrode having one pole is formed to be perpendicular to the surface of the substrate within the insulating layer, and
the connection electrode having another pole is formed to be perpendicular to the surface of the substrate within the insulating layer.

3. The phase change memory of claim 1, wherein the electrode layer having one pole and the electrode layer having another pole are formed at different positions from the surface of the substrate within the insulating layer, and a direction in which the electrode layer having one pole extends and a direction in which the electrode layer having another pole extends are perpendicular to the surface of the substrate.

4. The phase change memory of claim 3, wherein the respective sides of the lower portion of the opening portion are formed to have an angle of about 45 degrees with respect to the direction in which the electrode layer having one pole extends and the direction in which the electrode layer having another pole extends.

5. The phase change memory of claim 1, wherein the phase change portion is formed of GeSbTe or AgInSbTe.

6. The phase change memory of claim 1, wherein a part of the connection electrode having one pole and a part of the connection electrode having another pole are formed to have a hollow prism.

* * * * *